US011219126B2

(12) United States Patent
Okamura et al.

(10) Patent No.: US 11,219,126 B2
(45) Date of Patent: Jan. 4, 2022

(54) CONDUCTIVE PATTERN

(71) Applicant: NINTENDO CO., LTD., Kyoto (JP)

(72) Inventors: Takanori Okamura, Kyoto (JP); Kohei Odanaka, Kyoto (JP); Masaya Takei, Kyoto (JP)

(73) Assignee: NINTENDO CO., LTD., Kyoto (JP)

( * ) Notice: Subject to any disclaimer, the term of this patent is extended or adjusted under 35 U.S.C. 154(b) by 0 days.

(21) Appl. No.: 17/015,446

(22) Filed: Sep. 9, 2020

(65) Prior Publication Data

US 2021/0076493 A1    Mar. 11, 2021

(30) Foreign Application Priority Data

Sep. 10, 2019  (JP) .............................. JP2019-164740

(51) Int. Cl.
| | | |
|---|---|---|
| *H01H 13/10* | (2006.01) | |
| *H05K 1/11* | (2006.01) | |
| *H01H 1/06* | (2006.01) | |
| *H01H 11/04* | (2006.01) | |
| *H01H 13/78* | (2006.01) | |

(Continued)

(52) U.S. Cl.
CPC .............. *H05K 1/111* (2013.01); *H01H 1/06* (2013.01); *H01H 11/04* (2013.01); *H01H 13/10* (2013.01); *H01H 13/78* (2013.01); *H01H 25/04* (2013.01); *H01H 25/041* (2013.01); *H05K 1/0298* (2013.01); *H05K 1/18* (2013.01); *H01H 2203/038* (2013.01)

(58) Field of Classification Search
CPC .......... H01H 1/06; H01H 11/04; H01H 13/10; H01H 13/702; H01H 13/785; H01H 1/029; H01H 2201/032; H01H 13/705; H01H 13/80; H01H 13/02; H01H 13/12; H01H 13/70; H01H 13/7006; H01H 13/807; H01H 25/041; H01H 13/78; H01H 25/04; H01H 2203/038; H01H 1/403; H01H 2203/04; H01H 2203/054; H05K 1/111; H05K 1/0298; H05K 1/18
See application file for complete search history.

(56) References Cited

U.S. PATENT DOCUMENTS 3,916,360 A  10/1975 Pedersen et al.
5,536,911 A   7/1996 Madill
(Continued)

FOREIGN PATENT DOCUMENTS

JP          5394527          1/2014

OTHER PUBLICATIONS

Extended European Search Report dated Jan. 2, 2021 in corresponding European Application No. 20195311.4, 13 pages.

*Primary Examiner* — Ahmed M Saeed
(74) *Attorney, Agent, or Firm* — Nixon & Vanderhye P.C.

(57) ABSTRACT

A first conductive pattern according to the present disclosure includes a first land electrode and a second land electrode, in which at least a portion of the first land electrode is arranged in an inner portion of a first circle defined by a center point and a first radius, the second land electrode is arranged on a second circle defined by the center point and a second radius that is larger than the first radius to surround the first land electrode, the second land electrode is not arranged in the inner portion of the first circle, the first land electrode is not arranged on the second circle, and the first land electrode and the second land electrode are arranged on a third circle defined by the center point and a third radius that is larger than the first radius and is smaller than the second radius.

19 Claims, 19 Drawing Sheets

(51) Int. Cl.
*H01H 25/04* (2006.01)
*H05K 1/02* (2006.01)
*H05K 1/18* (2006.01)

(56) References Cited

U.S. PATENT DOCUMENTS 7,030,329 B1 4/2006 Sneek et al.
2004/0104727 A1 6/2004 Morimoto

CONDUCTIVE PATTERN

CROSS REFERENCE TO RELATED APPLICATION

This application claims priority to Japanese Patent Application No. 2019-164740 filed on Sep. 10, 2019, the entire contents of which are incorporated herein by reference.

TECHNICAL FIELD

The present invention relates to a conductive pattern, a switch device provided with the conductive pattern, a method for manufacturing a switch device, and a method for manufacturing an input device.

BACKGROUND ART

Japanese Patent No. 5394527 discloses a conductive pattern used in a switch device. This conductive pattern has a plurality of land electrodes formed in the form of a thin film on a printed-circuit board, and is configured to electrically connect the plurality of land electrodes as a result of the conductive pattern coming into contact with a conductive member such as conductive rubber.

SUMMARY OF THE INVENTION

Incidentally, examples of a conductive member include dome-shaped conductive members used in a so-called dome switch, in addition to conductive rubber such as that described above. However, no land electrodes are formed at the center of the conductive pattern disclosed in Japanese Patent No. 5394527, and thus the land electrodes cannot be electrically connected using a dome-shaped conductive member. The present invention has been made to resolve this issue, and aims to provide a conductive pattern with which it is possible to design a switch device, regardless of the types of conductive members. Alternatively, the present invention aims to provide a conductive pattern having a new structure.

A first conductive pattern according to the present disclosure includes a first land electrode and a second land electrode, in which at least a portion of the first land electrode is arranged in an inner portion of a first circle defined by a center point and a first radius, the second land electrode is arranged on a second circle defined by the center point and a second radius that is larger than the first radius, the second land electrode is not arranged in an inner portion of the first circle, the first land electrode is not arranged on the second circle, and the first land electrode and the second land electrode are arranged on a third circle defined by the center point and a third radius that is larger than the first radius and is smaller than the second radius.

According to this configuration, the following effects can be obtained. When electrical connection between a first land electrode and a second land electrode that is formed to surround the first land electrode is realized using a conductive member such as conductive rubber, for example, usually, as a result of the conductive member coming into contact with the conductive pattern such that the center of the first land electrode and the center of the conductive rubber coincide with each other, the first land electrode and the second land electrode are electrically connected to each other. Hereinafter, the position of the conductive member at this time will be referred to as a "reference position". However, if the conductive member comes into contact with the conductive pattern at a position displaced from the reference position, it is conceivable that the conductive member comes into contact with only the second land electrode.

To address this, with the conductive pattern according to the present disclosure, three concentric circles having different radii are defined, the first land electrode is arranged in the inner portion of the first circle having the smallest radius, and the second land electrode is arranged to pass through the second circle having the largest radius. Also, the third circle whose radius is larger than that of the first circle and is smaller than that of the second circle is defined, and a configuration is adopted in which portions of the land electrodes are arranged on the third circle. Thus, even if the conductive member comes into contact with the conductive pattern such that the conductive member is displaced outward of the first circle, the conductive member comes into contact with the two land electrodes arranged on the third circle located outside the first circle, and thus electrical connection can be realized.

Thus, by arranging the conductive member such that the outer edge of the conductive member is disposed on the outer side of the third circle at the reference position, even if the conductive member is not large enough to come into contact with the second circle, or if the reference position or the conductive rubber is displaced, the land electrodes can be electrically connected to each other.

Also, this first conductive pattern includes the first land electrode and the second land electrode formed to surround the first land electrode, and thus is also compatible with a dome-shaped conductive member used in a so-called dome switch. That is, when a state in which the circumferential edge of the dome-shaped conductive member is in contact with the second land electrode is regarded as a not-electrically connected state, by pressing down the center of the conductive member, the pressed center portion can be brought into contact with the first land electrode surrounded by the second land electrode, and thus the two land electrodes can be electrically connected to each other.

A configuration may be adopted in which, with the above-described first conductive pattern, at least a portion of the second land electrode is arranged on an outer side of the second circle, and the first land electrode is not arranged on the outer side of the second circle.

A configuration may be adopted in which, with the above-described first conductive pattern, the first land electrode includes a main portion arranged in the inner portion of the first circle, and at least one inner protruding portion that protrudes radially outward from the main portion, the second land electrode includes an outer circumferential portion arranged outside of the second circle and at least one outer protruding portion that protrudes radially inward from the outer circumferential portion, and the inner protruding portion and the outer protruding portion are arranged on the third circle.

With the above-described first conductive pattern, the inner protruding portion and the outer protruding portion may be arranged on the third circle in an alternating manner.

According to this configuration, when the conductive member is displaced from the reference position, it is possible to bring the conductive member into contact with anyone of the inner protruding portion and the outer protruding portion that are adjacent to each other on the third circle. Thus, it is possible to handle the displacement of the conductive member in different directions, and the two land electrodes can be readily and electrically connected to each other via the conductive member.

With the above-described first conductive pattern, the inner protruding portion and the outer protruding portion that are adjacent to each other on the third circle may be arranged in any one of arcs of the third circle that have a central angle of 180 degrees.

According to this configuration, because the inner protruding portion and the outer protruding portion are arranged in any one of the arcs of the third circle that have a central angle of 180 degrees, the two land electrodes can be electrically connected to each other due to the conductive member coming into contact with the conductive pattern to cover the half or more of the circumference of the third circle. Thus, it is possible to increase the allowable range of the displacement of the conductive member from the reference position. That is, the two land electrodes can be readily and electrically connected to each other via the conductive member, regardless of the direction of the displacement of the conductive member.

A configuration may be adopted in which, with the above-described first conductive pattern, a first conductive member having a contact surface is arranged, and the contact surface of the first conductive member is capable of coming into contact with both the first land electrode and the second land electrode. That is, the contact surface is configured to have a state in which the contact surface is in contact with the first and second land electrodes, and a state in which the contact surface is not in contact with the first or second land electrodes.

A configuration may be adopted in which, in the above-described first conductive pattern, a dome-shaped second conductive member is arranged, a circumferential edge portion of the second conductive member is fixed to the second land electrode, and a center portion of the second conductive member comes into contact with the first land electrode when pressed down.

A first switch device according to the present disclosure includes at least one first contact portion that has any one of the conductive patterns described above and at least one second contact portion having any one of the conductive patterns described above, a first conductive member for electrical connection at the first contact portion, and a second conductive member for electrical connection at the second contact portion, in which the first conductive member has a contact surface capable of coming into contact with both the first land electrode and the second land electrode, the second conductive member is formed into a dome shape, a circumferential edge portion of the second conductive member is fixed to the second land electrode, and the second conductive member is configured such that a center portion thereof comes into contact with the first land electrode when pressed down.

As described above, the first conductive pattern according to the present disclosure enables electrical connection with use of not only the first conductive member such as conductive rubber but also the second conductive member having a dome shape, for example. Thus, even if electrical connection is realized by two types of conductive members, it is possible to arrange conductive patterns having the same configuration at the contact portions. Therefore, a conductive pattern need not be changed depending on the types of conductive members, and it is possible to easily constitute a switch device.

A second switch device according to the present disclosure has four third contact portions that each have any one of the conductive patterns described above, and a direction input portion that has four conductive members that are arranged above the third contact portions and are capable of respectively coming into contact with the third contact portions, in which the four third contact portions are arranged at 90-degree intervals on a predetermined circle, the direction input portion is configured to cause the conductive members to come into contact with the third contact portions due to the direction input portion being inclined around a fulcrum provided at a position corresponding to a center point of the predetermined circle, and the first land electrodes and the second land electrodes at the third contact portions are arranged on the predetermined circle.

A third switch device according to the present disclosure has four fourth contact portions that each have any one of the conductive patterns described above, and a direction input portion that has four conductive members that are arranged above the fourth contact portions and are capable of respectively coming into contact with the four fourth contact portions, in which the four fourth contact portions are arranged at 90-degree intervals on a predetermined circle, the direction input portion is configured to cause the conductive members to come into contact with the fourth contact portions due to the direction input portion being inclined around a fulcrum provided at a position corresponding to a center point of the predetermined circle, the first land electrodes and the second land electrodes at the fourth contact portions are arranged on the predetermined circle, in each of the fourth contact portions, the second land electrode is provided with at least one slit for connecting a region that is surrounded by the second land electrode and is located between the first land electrode and the second land electrode, and an external portion of the second land electrode, and the slit in each of the fourth contact portions is arranged at a position located farthest from the center point of the predetermined circle.

According to this configuration, the positions of the slits are symmetric due to the fourth contact portions being provided with the slits as described above, and stable operations can be expected.

A method for manufacturing a switch device according to the present disclosure includes forming at least one of the above-described conductive patterns on a printed-circuit board, and arranging a first conductive member or a second conductive member at a position that corresponds to at least one of the conductive patterns, in which the first conductive member has a contact surface capable of coming into contact with both the first land electrode and the second land electrode, the second conductive member is formed into a dome shape, a circumferential edge portion of the second conductive member is fixed to the second land electrode, and the second conductive member is configured such that a center portion thereof comes into contact with the first land electrode when pressed down.

According to this configuration, the conductive pattern realizes electrical connection even if either the first conductive member or the second conductive member is used, and thus, it is possible to form a plurality of one type of conductive pattern on a printed-circuit board, and to arrange either the first conductive members or the second conductive members at positions corresponding to the conductive patterns, according to a user request or the like, for example. Thus, because it is not necessary to individually form conductive patterns that are compatible with the conductive members, it is possible to simplify a switch device and to shorten a manufacturing process.

A method for manufacturing an input device according to the present disclosure includes preparing a printed-circuit board provided with a plurality of any one of the conductive patterns described above, receiving, from a user, in the input device in which the printed-circuit board is housed, information as to which of the first conductive member or the second conductive member is to be arranged at positions that correspond to the conductive patterns, acquiring the information, and attaching either the first conductive member or the second conductive member to the positions that correspond to the conductive patterns in the input device, based on the information, in which the first conductive member has a contact surface capable of coming into contact with both the first land electrode and the second land electrode, the second conductive member is formed into a dome shape, a circumferential edge portion of the second conductive member is fixed to the second conductive member, and the second conductive member is configured such that a center portion thereof comes into contact with the first land electrode when pressed down.

According to this configuration, the above-described conductive pattern is compatible with both the first conductive member and the second conductive member, and thus, it is possible to mount a switch device that is compatible with each conductive pattern onto an input device provided with a plurality of conductive patterns, according to a user request or the like. Thus, it is possible to manufacture an input device having a switch device selected according to a user request.

A second conductive pattern according to the present invention includes a first land electrode having a circular main portion and a second land electrode provided to surround the surrounding portion of the first land electrode, in which the first land electrode includes at least one first protruding portion that protrudes from the main portion toward the second land electrode, a distance from the center of the main portion to a leading end of the first protruding portion is a first distance, the second land electrode includes at least one second protruding portion that protrudes toward the main portion of the first land electrode, and a distance from the center of the main portion of the first land electrode to a leading end of the second protruding portion is a second distance that is shorter than the first distance.

The above-described second conductive pattern may be provided with two of the second protruding portions, and the second protruding portions may be arranged to surround the first land electrode (specifically, the first protruding portion) in the circumferential direction. Alternatively, with the second conductive pattern, two of the first protruding portions and two of the second protruding portions are provided such that the first protruding portions and the second protruding portions are arranged in an alternating manner in the circumferential direction. Also, three or more of the first protruding portions and three or more of the second protruding portions may be provided. At this time, the first protruding portions and the second protruding portions may be arranged in an alternating manner in the circumferential direction.

According to the present disclosure, it is possible to design a switch device regardless of the types of conductive members.

EMBODIMENTS OF THE INVENTION

A. First Embodiment

Hereinafter, a conductive pattern according to the present disclosure and a first embodiment of a switch device having this conductive pattern will be described with reference to the drawings.

Figure 1:
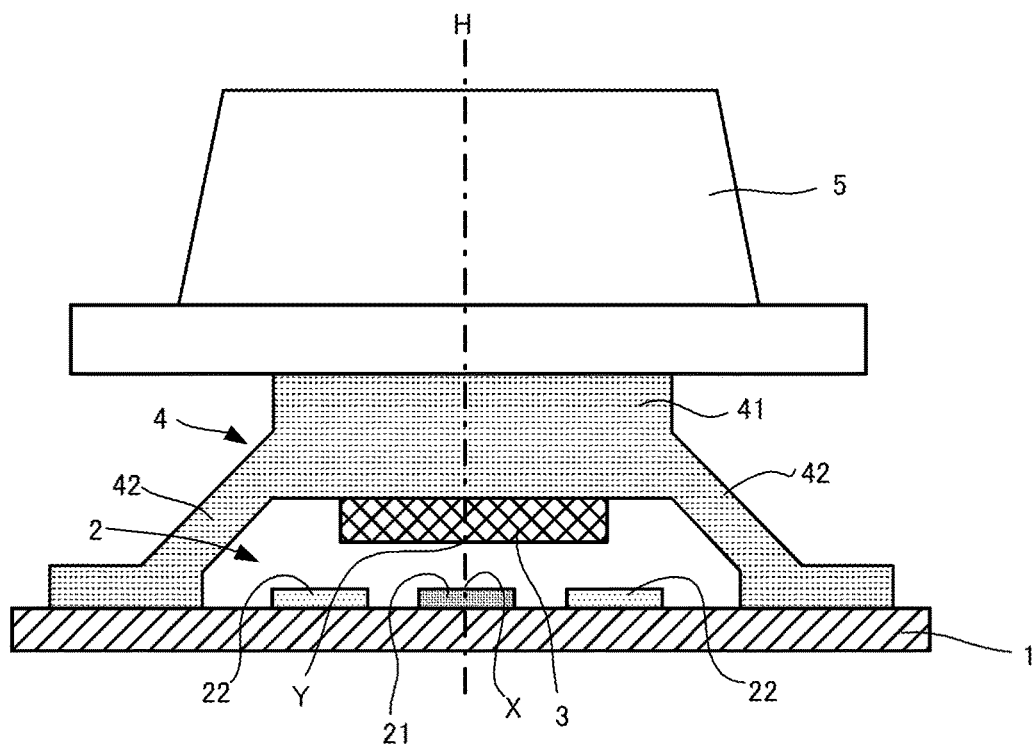
FIG. 1 is a cross-sectional view showing a first embodiment of a switch device according to the present invention.
Figure 2:
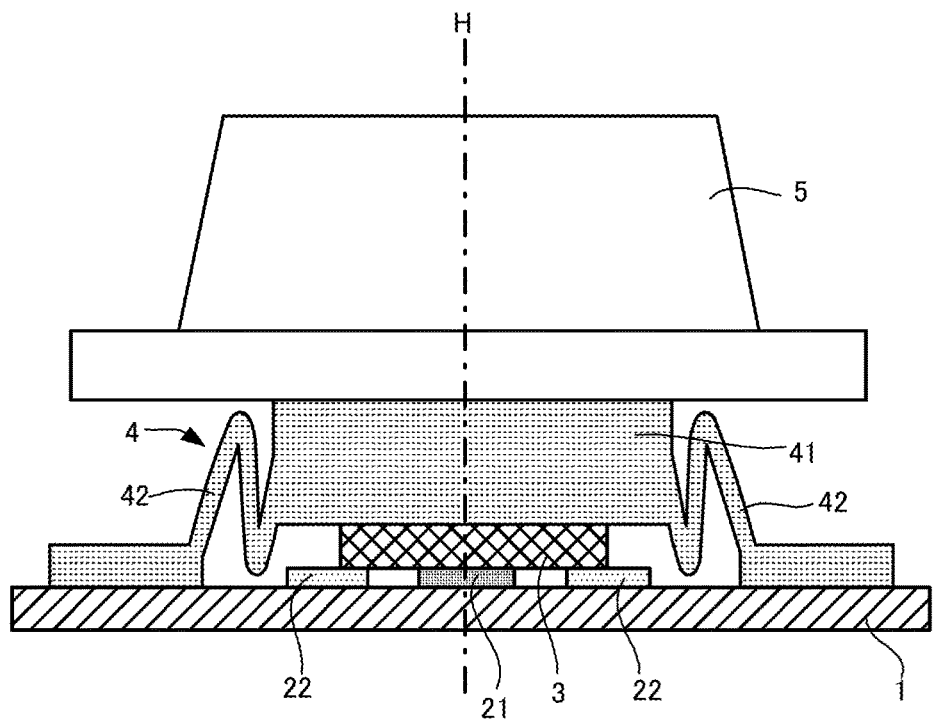
FIG. 2 is a cross-sectional view of the first switch device shown in FIG. 1 that is in an electrically connected state.

A first switch device according to the first embodiment is a so-called rubber switch that is used for various input devices such as a controller of a game device, various remote controllers for various electronic devices, and operation panels, for example. FIG. 1 is a cross-sectional view of the first switch device that is in the initial state (not-electrically connected state), and FIG. 2 is a cross-sectional view of the first switch device that is pressed down and is in an electrically connected state. Note that, as will be described later, FIG. 2 shows a state in which conductive rubber 3 is located at a reference position.

1. Overview of First Switch Device

As shown in FIG. 1, a first switch device 10 has a printed-circuit board 1 and a conductive pattern 2 formed on the printed-circuit board 1. As will be described later, the conductive pattern 2 has two land electrodes 21 and 22, and these land electrodes 21 and 22 are electrically connected to a predetermined circuit. Also, a round columnar conductive rubber (first conductive member) 3 is provided above the conductive pattern 2, and a support member 4 is provided to support the conductive rubber 3. Also, a button member 5 is attached to an upper surface of the support member 4.

The support member 4 is made of a material capable of elastic deformation, such as rubber, and the support member 4 has a round columnar main portion 41 and leg portions 42 that support the main portion 41, and extend downward and widen at the bottom portions thereof. The main portion 41 is arranged above the conductive pattern 2, and the conductive rubber 3 is attached to a lower surface of the main portion 41. Also, upper end portions of the above-described leg portions 42 are linked to aside surface of the main portion 41, and lower end portions of the leg portions 42 are fixed to the printed-circuit board 1 to surround the surrounding portion of the conductive pattern 2. Accordingly, in the initial state shown in FIG. 1, the main portion 41 is held by the leg portions 42 at a position located a predetermined distance away from the conductive pattern 2. Because the conductive rubber 3 is attached to the lower surface of the main portion 41, a planar lower surface (a contact surface) of the conductive rubber 3 and the conductive pattern 2 are arranged to face each other with a gap therebetween.

When the button member 5 is pressed down from the state shown in FIG. 1, the leg portions 42 made of an elastic material are bent, and accordingly, the main portion 41 is moved downward together with the conductive rubber 3, and the conductive rubber 3 comes into contact with the conductive pattern 2. As a result, the two land electrodes 21 and 22 of the conductive pattern 2 are electrically connected to each other via the conductive rubber 3. On the other hand, when the button member 5 is released, the elastically deformed leg portions 42 is restored to the initial state, and accordingly, the conductive rubber 3 and the conductive pattern 2 are separated from each other. As a result, the electrical connection between the two land electrodes 21 and 22 is released.

2. Conductive Pattern

Figure 3:
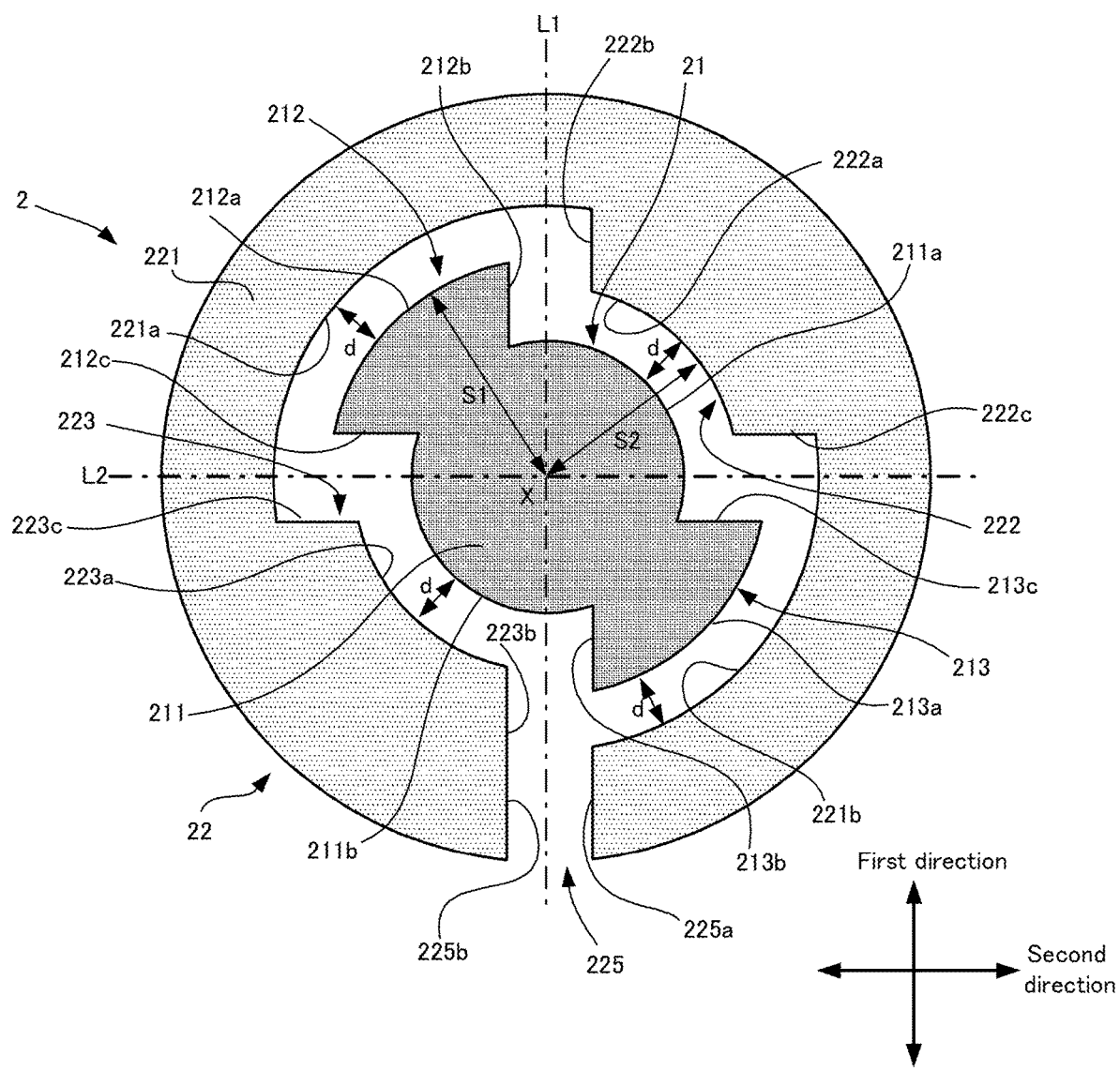
FIG. 3 is a plan view of a conductive pattern used in the first switch device shown in FIG. 1.

Next, the conductive pattern 2 will be described. FIG. 3 is a plan view of the conductive pattern. Note that, although the following description will be given based on the directions shown in FIG. 3, this is an example, and the conductive pattern according to the present invention is not limited to this direction.

As shown in FIG. 3, the conductive pattern 2 has two land electrodes that are made of a conductive material such as copper or silver and are in the form of thin film, that is, the conductive pattern 2 has a first land electrode 21 and a second land electrode 22. First, the first land electrode 21 will be described. The first land electrode 21 has a circular main portion 211, and two inner protruding portions 212 and 213 that protrude radially outward from the main portion 211, and these portions are formed as a single body. Hereinafter, for convenience of description, it is presumed that a line that passes through the center of the main portion 211 and extends in a first direction is referred to as a line L1, and a line that extends in a second direction that is perpendicular to the first direction is referred to as a line L2. Also, it is presumed that the center of the main portion 211 is referred to as a "center point X" (the intersection of the lines L1 and L2).

One inner protruding portion 212 protrudes from the upper left of the main portion 211 in FIG. 3 between the line L1 and the line L2, and the other inner protruding portion 213 protrudes from the lower right of the main portion 211 between the line L1 and the line L2. That is, the two inner protruding portions 212 and 213 are arranged on opposite sides of the center of the main portion 211. Hereinafter, for convenience of description, it is presumed that the inner protruding portion arranged on the upper left in FIG. 3 is referred to as a "first inner protruding portion 212", and the inner protruding portion arranged on the lower right in FIG. 3 will be referred to as a "second inner protruding portion 213".

The inner protruding portions 212 and 213 are formed in a fan shape having a central angle of about 90 degrees, and are linked to the main portion 211 such that the tops thereof are included in the main portion 211. More specifically, the inner protruding portion 212 has a region surrounded by an arc portion 212a having a central angle of about 90 degrees and a pair of linear portions 212b and 212c that are respectively connected to two ends of the arc portion 212a, and the inner protruding portion 213 has a region surrounded by an arc portion 213a having a central angle of about 90 degrees, and a pair of linear portions 213b and 213c that are respectively connected to two ends of the arc portion 213a, and these regions protrude from the main portion 211. Also, the first inner protruding portion 212 is configured such that one linear portion, that is, a first linear portion 212b thereof extends in a first direction, and the other linear portion, that is, a second linear portion 212c extends in a second direction. Also, the second inner protruding portion 213 is configured in a manner similar to that of the first inner protruding portion 212, and the second inner protruding portion 213 is formed to be symmetric with respect to the center of the main portion 211. The inner protruding portions 212 and 213 are each substantially fan-shaped, and thus, are formed to widen in the circumferential direction outward in the radial direction.

Also, for convenience of description, it is presumed that, at the outer edge of the main portion 211, a portion located between the first linear portion 212b of the first inner protruding portion 212 and the second linear portion 213c of the second inner protruding portion 213 is referred to as a "first outer edge portion 211a", and a portion located between the second linear portion 212c of the first inner protruding portion 212 and the first linear portion 213b of the second inner protruding portion 213 is referred to as a "second outer edge portion 211b".

Next, the second land electrode 22 will be described. The second land electrode 22 includes an annular outer circumferential portion 221 configured to surround the first land electrode 21, and two outer protruding portions 222 and 223 that protrude radially inward from an inner edge of the outer circumferential portion 221, and these portions are formed as a single body. The outer circumferential portion 221 is provided with a slit 225 that extends in the first direction on the lower side of FIG. 3. This slit 225 is formed on the above-described line L1 that passes through the center of the main portion 211 of the first electrode 21. More specifically, a right side edge 225a of the slit 225 is formed on an extension line of the first linear portion 213b of the second inner protruding portion 213, and a left side edge 225b of the slit 225 is formed symmetrically with the side edge 225a with respect to the line L1. Also, the left side edge 225b is continuous with the first linear portion 223b of the second outer protruding portion 223. Note that, in this embodiment, as is clear from FIG. 3, "surround the first land electrode 21" does not mean that the entire circumferential surface of the first land electrode 21 is surrounded without a gap. That is, the term "surround" in the present disclosure encompasses a state in which an electrode is arranged in a surrounding portion of an electrode without a gap, and a state in which an electrode is arranged in a portion of a surrounding portion of an electrode, as described in this embodiment.

Next, the outer protruding portions 222 and 223 will be described. One outer protruding portion 222 protrudes from the upper right of the outer circumferential portion 221 in FIG. 3 between the line L1 and the line L2, and the other outer protruding portion 223 protrudes from the lower left of the outer circumferential portion 221 between the line L1 and the line L2. That is, the two outer protruding portions 222 and 223 are arranged on opposite sides of the center of the outer circumferential portion 211 (which is also the center of the main portion 211). Hereinafter, for convenience of description, it is presumed that the outer protruding portion arranged on the upper right in FIG. 3 is referred to as a "first outer protruding portion 222", and the outer protruding portion arranged on the lower left in FIG. 3 is referred to as a "second outer protruding portion 223".

First, the first outer protruding portion 222 will be described. The first outer protruding portion 222 is arranged to face the first outer edge portion 211a of the main portion 211, and has a region surrounded by an arc portion 222a that extends in parallel to the first outer edge portion 211a and has a central angle of about 90 degrees, and a pair of linear portions 222b and 222c that are respectively connected to two ends of the arc portion 222a, and this region protrudes from the outer circumferential portion 221. Also, the first outer protruding portion 222 is configured such that one linear portion, that is, the first linear portion 222b extends in the first direction, and the other linear portion, that is, the second linear portion 222c extends in the second direction.

More specifically, the first linear portion 222b is arranged at a position that is symmetric with the first linear portion 212b of the first inner protruding portion 212 with respect to the line L1, and the second linear portion 222c is arranged at a position that is symmetric with the second linear portion 213c of the second inner protruding portion 213 with respect to the line L2. Also, the arc portion 222a is closer to the center point X than the arc portions 212a and 213a of the inner protruding portions 212 and 213 are.

The second outer protruding portion 223 is also formed in a manner similar to that of the first outer protruding portion 222, and is provided at a position that is point symmetric to the center X. Also, the first linear portion 223b of the second outer protruding portion 223 extends in the first direction so as to be continuous with the left side edge 225b of the slit 225. The outer protruding portions 222 and 223 are formed to be narrower in the circumferential direction inward in the radial direction.

Also, for convenience of description, it is presumed that, at the inner edge of the outer circumferential portion 221, a portion located between the first linear portion 222b of the first outer protruding portion 222 and the second linear portion 223c of the second outer protruding portion 223 will be referred to as a "first inner edge portion 221a", and a portion located between the second linear portion 222c of the first outer protruding portion 222 and the slit 225 is referred to as a "second inner edge portion 221b". Also, the first inner edge portion 221a faces the first inner protruding portion 212, and the second inner edge portion 221b faces the second inner protruding portion 213. Also, a distance d therebetween in a radial direction in which these portions face each other is substantially the same as the distance d between the first outer edge portion 211a and the first outer protruding portion 222, in which the first outer edge portion 211a and the first outer protruding portion 222 face each other, and is substantially the same as the distance d between the second outer edge portion 211b and the second outer protruding portion 223, in which the second outer edge portion 211b and the second outer protruding portion 223 face each other.

Figure 17:
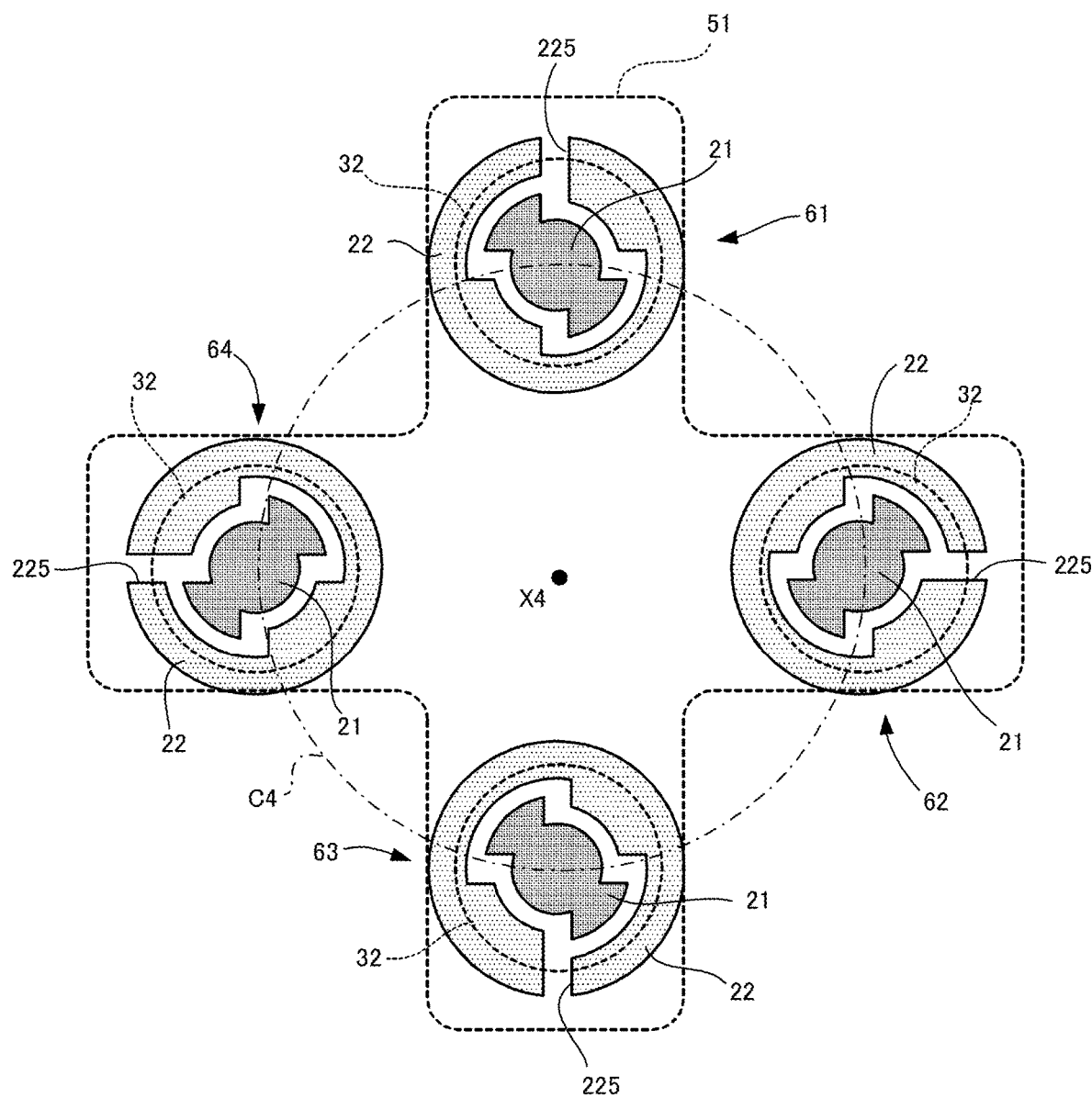
FIG. 17 is a plan view showing the arrangement of a conductive pattern in the third switch device shown in FIG. 12.

Note that, although the inner protruding portions 212 and 213 are respectively arranged on the upper right and the lower left, and the outer protruding portions 222 and 223 are arranged on the upper left and the lower right in the example shown in FIG. 3, there is no particular limitation on the rotation position of the conductive pattern 2, and as shown in FIG. 17 that will be described later, the conductive pattern 2 may be rotated and arranged as appropriate, for example. Note that the rotation position of the conductive pattern 2 in FIG. 3 will be referred to as a "reference rotation position" hereinafter.

3. Positional Relationship Between Two Land Electrodes

Figure 4:
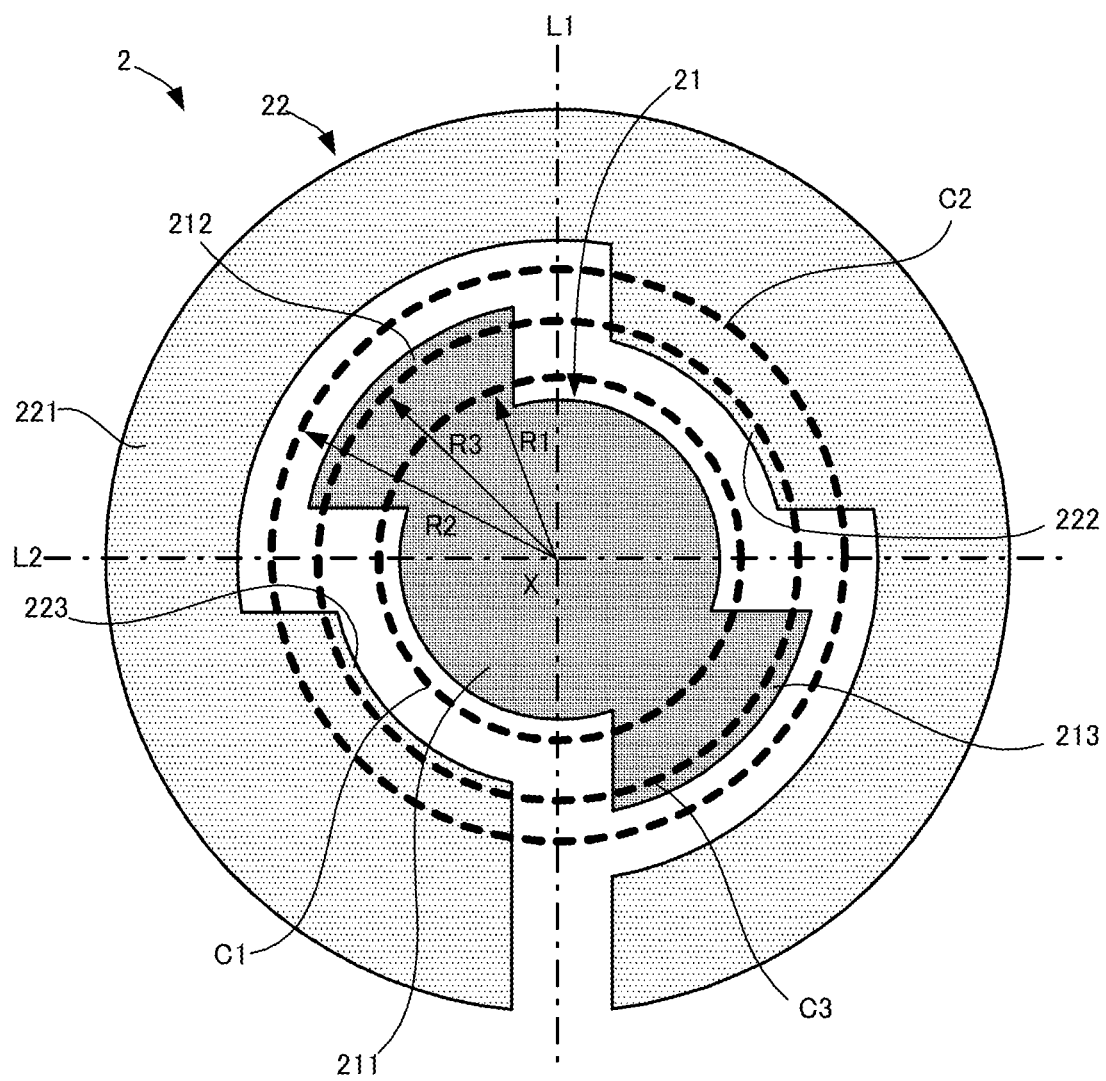
FIG. 4 is a plan view showing a positional relationship between a first land electrode and a second land electrode.

Next, the positional relationship between the first land electrode 21 and the second land electrode 22 will be described. First, as shown in FIG. 3, in the conductive pattern 2, the inner protruding portions 212 and 213 and the outer protruding portions 222 and 223 are arranged at 90-degree intervals in an alternating manner in the circumferential direction. Also, as shown in FIG. 4, three concentric circles having a center point X, namely, a first circle C1, a second circle C2, and a third circle C3 are defined. The first circle C1 is a circle having a radius R1, and the main portion 211 of the first land electrode 21 is arranged in the inner portion of the first circle C1. However, no second land electrode 22 is arranged in the inner portion of the first circle C1. The second circle C2 is a circle having a radius R2, and has the largest radius, out of the three circles. Also, only the second land electrode 22 is arranged on the circumference of the second circle C2, and no first land electrode 21 is arranged thereon. Specifically, a configuration is adopted in which the second circle C2 passes through the two outer protruding portions 222 and 223 of the second land electrode 22. Also, the outer circumferential portion 221 of the second land electrode 22 is arranged on the outer side of the second circle C2.

The third circle C3 is a circle having a radius R3. The radius R3 is larger than the radius R1, and is smaller than the radius R2. Also, both the first land electrode 21 and the second land electrode 22 are arranged on the circumference of the third circle C3. Specifically, these circles are configured to successively pass through the inner protruding portions 212 and 213 and the outer protruding portions 222 and 223 that are arranged in an alternating manner in the circumferential direction.

Also, although the lower surface of the conductive rubber 3 has a circular shape, when the button member 5 is pressed down, the conductive rubber 3 needs to come into contact with both the first land electrode 21 and the second land electrode 22 in order to realize electrical connection, and thus, the conductive rubber 3 is preferably a circle that is larger than the third circle C3 that passes through at least the first land electrode 21 and the second land electrode 22 when the center of the lower surface of the conductive rubber 3 is located above the center point X. The lower surface of the conductive rubber 3 according to the present embodiment has a circular shape that is larger than the second circle C2, and passes through the outer circumferential portion 221.

4. Studies on Contact Movement of Conductive Rubber to Conductive Pattern

Figure 5:
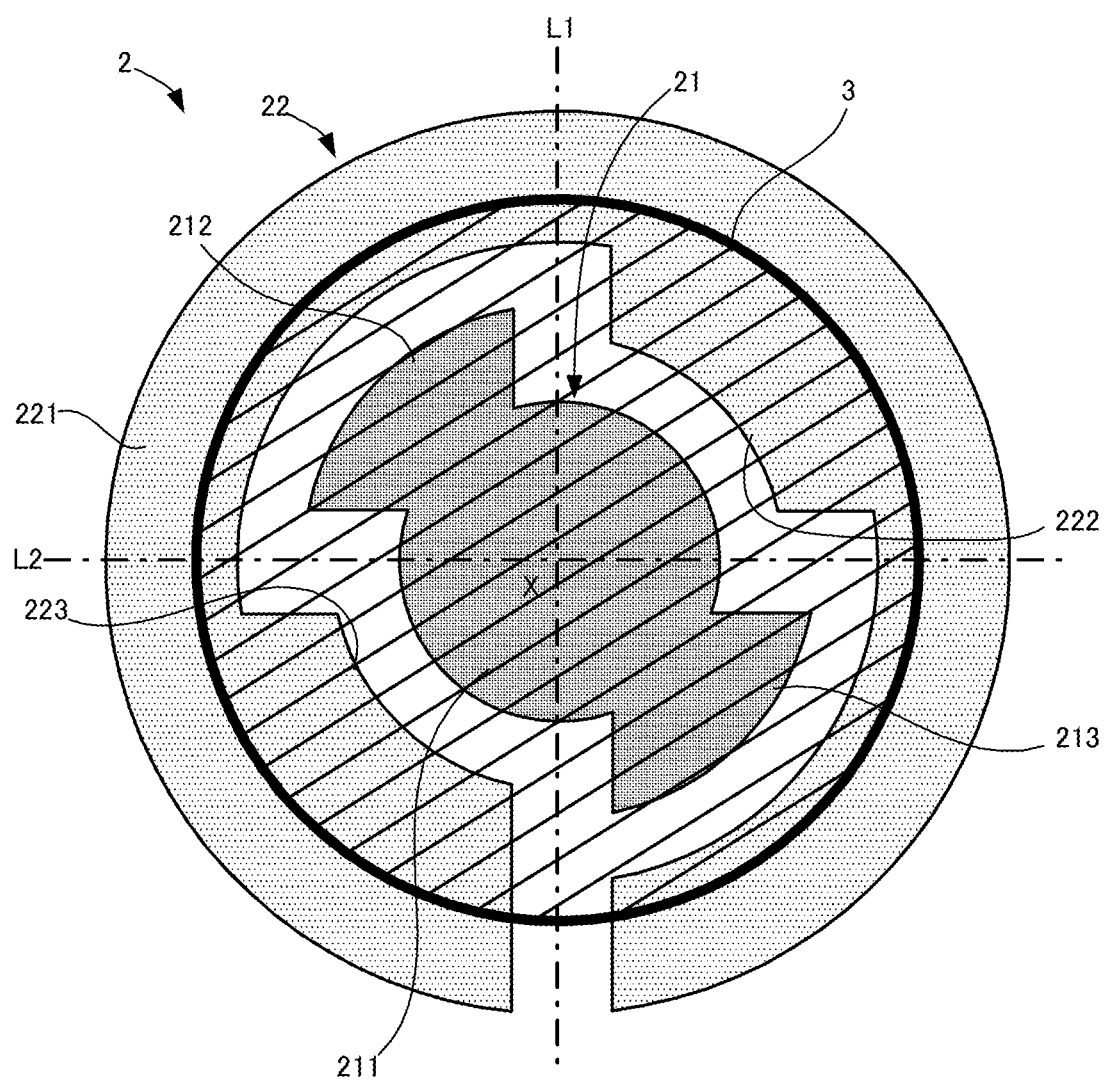
FIG. 5 is a plan view showing a state in which conductive rubber and a conductive pattern are in contact with each other.

Next, studies are conducted regarding contact movement of a conductive rubber to a conductive pattern. As described above, the lower surface of the conductive rubber 3 has a circular shape that is larger than the second circle C2, and passes through the outer circumferential portion 221. Thus, when the center of the button member 5 is pressed down and the conductive rubber 3 is moved downward, straightly, and in parallel to a perpendicular line H (see FIGS. 1 and 2) at the center point X, for example, as shown in FIG. 5, the conductive rubber 3 comes into contact with the conductive pattern 2. Accordingly, the first land electrode 21 and the second land electrode 22 are electrically connected to each other via the conductive rubber 3. At this time, a center Y of the conductive rubber 3 and the center X of the conductive pattern 2 substantially coincide with each other. The position of the conductive rubber 3 is referred to as a "reference position". Also, if the center of the button member 5 is pressed straightly down along the perpendicular line H, for example, pressure is substantially evenly applied to the lower surface of the conductive rubber 3. Note that, in FIGS. 5 to 9, a portion of the lower surface of the conductive rubber 3 to which force is applied strong enough to electrically connect the two land electrodes 21 and 22 is hatched. The same applies to second and third embodiments in this respect. Also, FIGS. 5 to 9 will be described following the directions shown in FIG. 5.

However, because the support member 4 is made of an elastic material, if an end portion of the button member 5 is pressed down, or, if the button member 5 is pressed down in a direction to intersect with the perpendicular line H, for example, there is a concern that the conductive rubber 3 does not move straightly downward, and the center Y of the conductive rubber 3 and the center X of the conductive pattern 2 will be displaced from each other. Also, a force caused as a result of the button member 5 being pressed down may not be evenly transmitted to the entire lower surface of the conductive rubber 3 and may be biased in one direction. In this case, there is a concern that the conductive rubber 3 may not evenly come into contact with the conductive pattern 2. Studies are conducted regarding contact movement of the conductive rubber 3 to the conductive pattern 2 in the above-described cases. Note that a description will be given following the directions shown in FIGS. 6 to 9.

Figure 6:
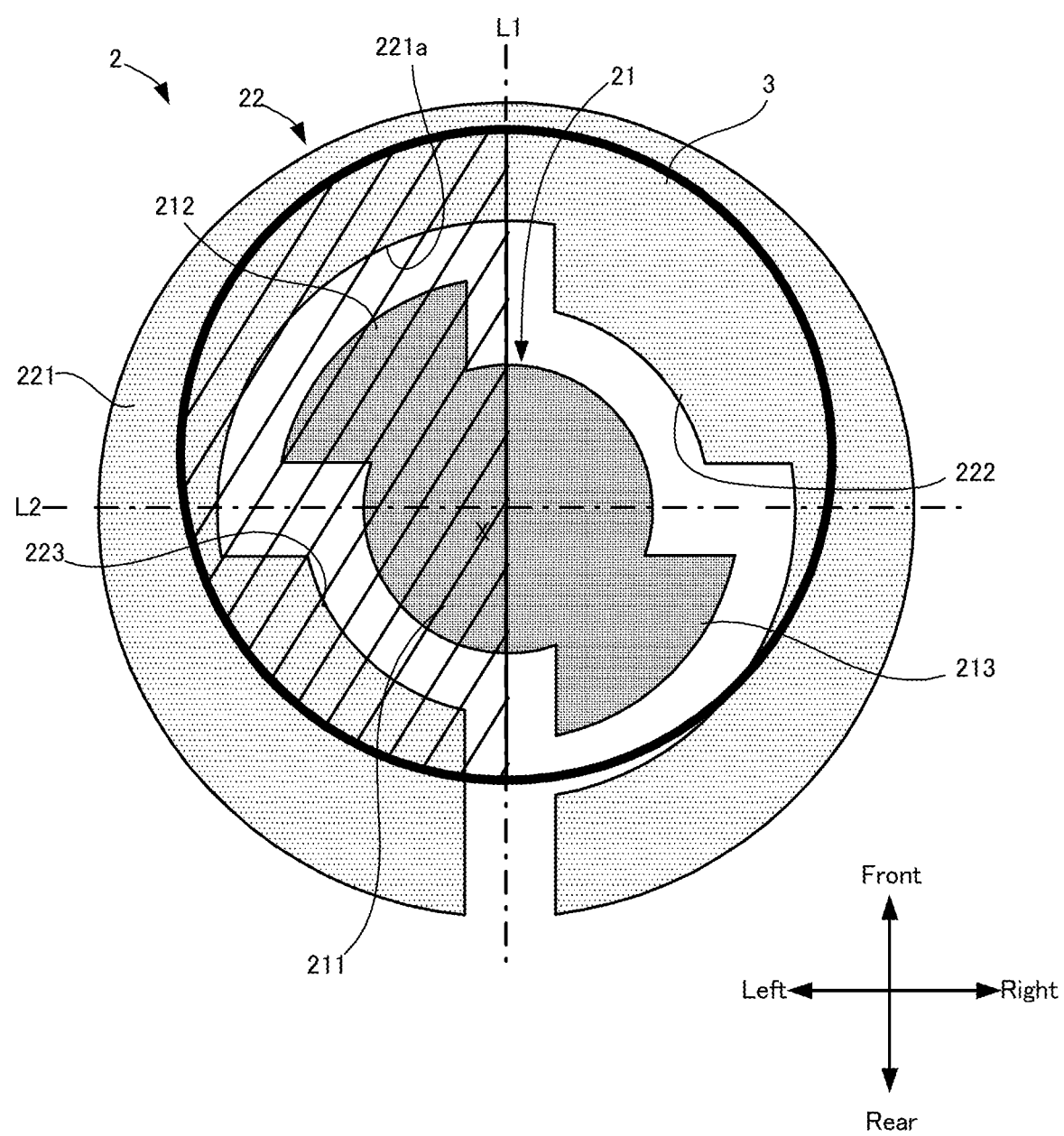
FIG. 6 is a plan view showing a state in which conductive rubber and a conductive pattern are in contact with each other.
Figure 7:
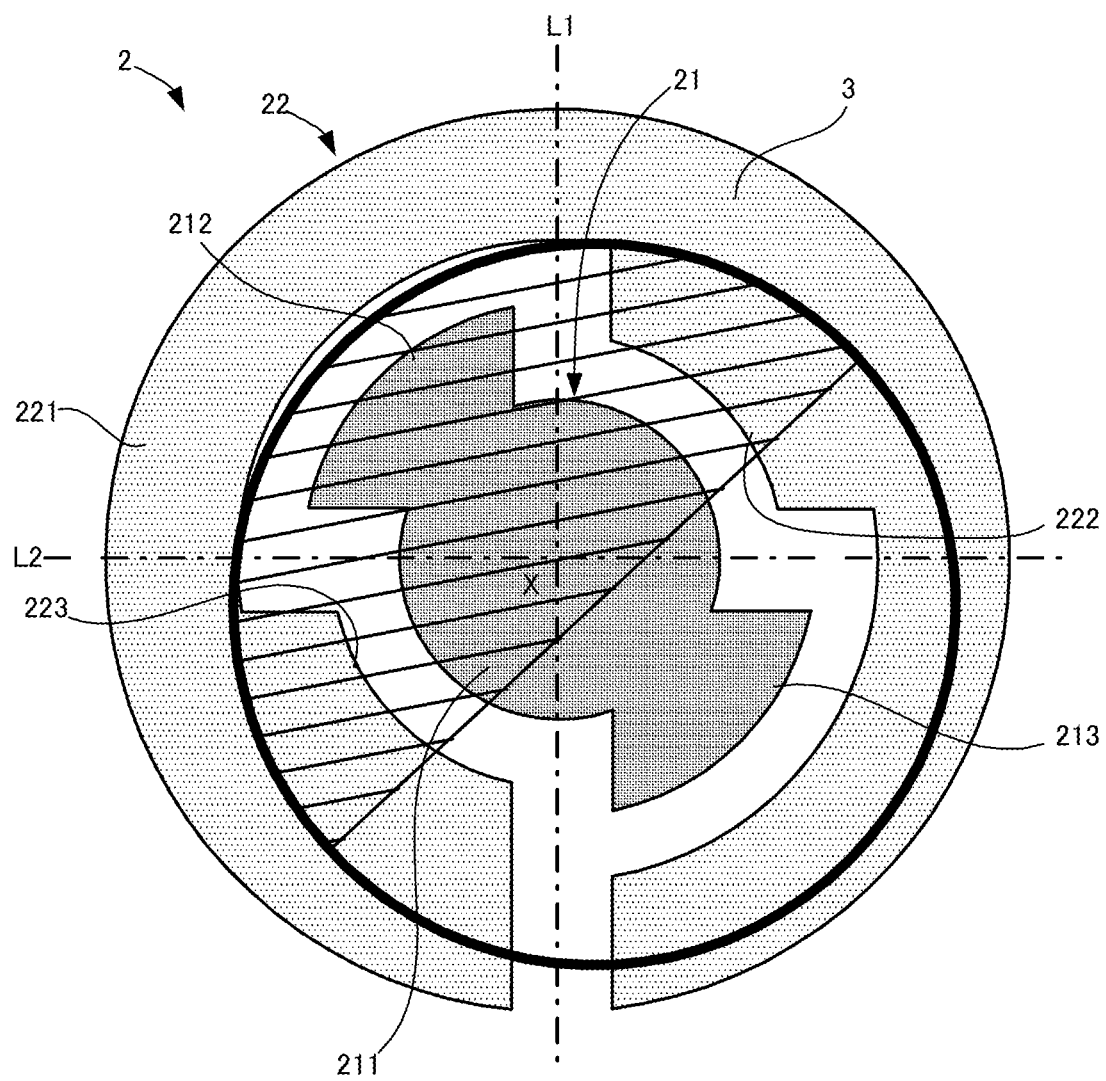
FIG. 7 is a plan view showing a state in which conductive rubber and a conductive pattern are in contact with each other.
Figure 8:
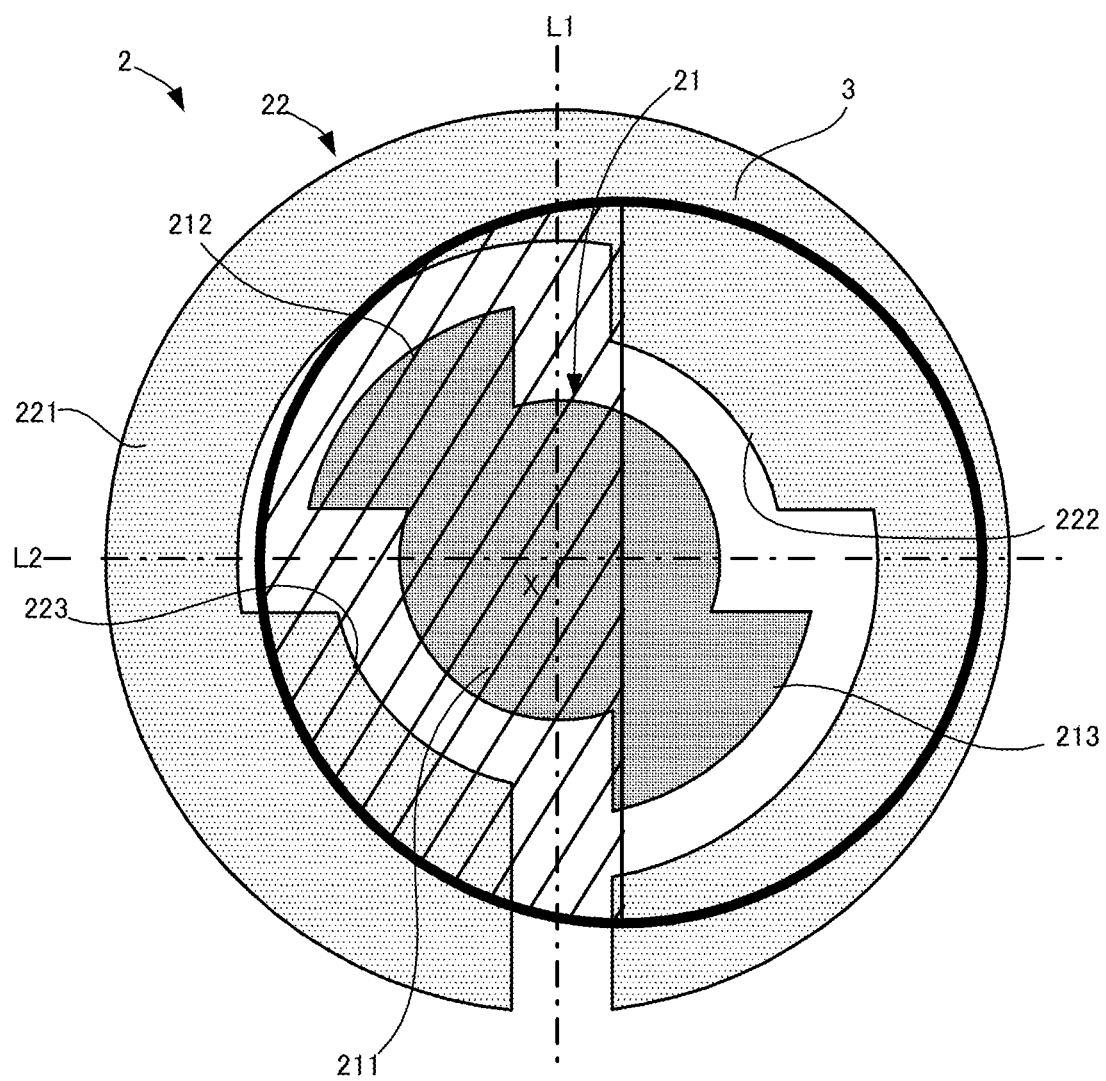
FIG. 8 is a plan view showing a state in which conductive rubber and a conductive pattern are in contact with each other.
Figure 9:
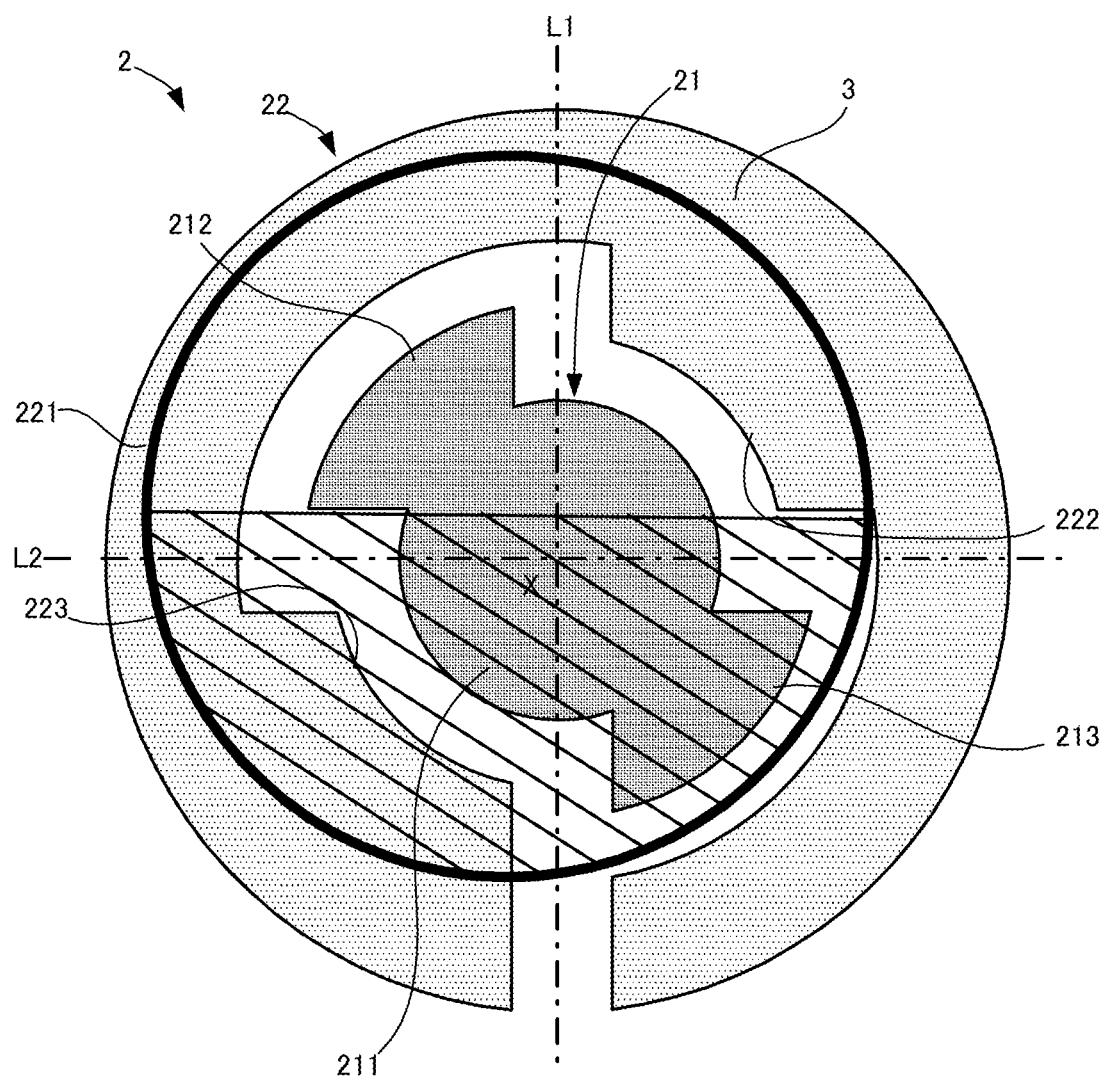
FIG. 9 is a plan view showing a state in which conductive rubber and a conductive pattern are in contact with each other.

First, even if, as shown in FIG. 6, a force caused as a result of the conductive rubber 3 being displaced forward with respect to the conductive pattern 2 and being pressed down is mainly applied to a left half of the conductive rubber 3, the first inner protruding portion 212 and the vicinity of the first inner edge portion 221a of the outer circumferential portion 221 come into contact with a portion to which the force of the conductive rubber 3 is applied, and are thus electrically connected to each other. Similarly, as shown in FIGS. 7 to 9, even if the conductive rubber 3 is displaced from the center X and the force applied to the conductive rubber is biased in one direction, the first land electrode 21 and the second land electrode 22 are electrically connected to each other.

5. Features

The conductive pattern according to this embodiment realizes the following effects.

(1) With the conductive pattern 2 according to this embodiment, three concentric circles C1 to C3 having different radii are defined, the first land electrode 21 is arranged in an inner portion of the first circle C1 having the smallest radius, and the second land electrode 22 is arranged to pass through the second circle C2 having the largest radius. Also, the third circle C3 whose radius is larger than that of the first circle C1 and is smaller than that of the second circle C2 is defined, and a configuration is adopted in which the inner protruding portions 212 and 213 of the first land electrode 21 and the outer protruding portions 222 and 223 of the second land electrode 22 are arranged on the third circle C3. Thus, even if the conductive rubber 3 comes into contact with the conductive pattern 2 such that the conductive rubber 3 is displaced outward of the first circle C1, for example, the conductive rubber 3 comes into contact with the inner protruding portions 212 and 213 and the outer protruding portions 222 and 223 that are arranged on the third circle C3 located on the outer side of the first circle C1, and thus an electrical connection can be realized.

Thus, by arranging the conductive rubber 3 such that at least the outer edge of the conductive rubber 3 is located outward of the third circle C3 at the reference position, even if the conductive rubber 3 is not large enough to come into contact with the second circle C2, or if the conductive rubber 3 is displaced from the reference position or the like, the land electrodes 21 and 22 can be electrically connected to each other.

(2) When the conductive rubber 3 is displaced from the reference position, the conductive rubber 3 can be brought into contact with any of the inner protruding portions 212 and 213 and the outer protruding portions 222 and 223 that are adjacent to each other on the third circle C3. Thus, it is possible to handle the displacement of the conductive rubber 3 in different directions, and the land electrodes 21 and 22 can be readily and electrically connected to each other via the conductive rubber 3.

In particular, the inner protruding portions 212 and 213 and the outer protruding portions 222 and 223 that are adjacent to each other are arranged in any of the arcs of the third circle C3 that have a central angle of 180 degrees. That is, the inner protruding portions 212 and 213 and the outer protruding portions 222 and 223 that are adjacent to each other are included in any of the arcs of the third circle C3 that have a central angle of 180 degrees. Thus, if the conductive rubber 3 comes into contact with the conductive pattern 2 at any position to cover the half or more of the circumference of the third circle C3, the two land electrodes 21 and 22 can be electrically connected to each other. Thus, even if the conductive rubber is displaced in any directions, the land electrodes 21 and 22 can be readily and electrically connected to each other via the conductive rubber 3.

B. Second Embodiment

Next, a second switch device according to a second embodiment of the present disclosure will be described with reference to the drawings. The second switch device is a so-called dome switch, and is different from the above-described first switch device in the configurations of the support member and the conductive member. In the following description, structures that are the same as those of the first switch device are given the same reference numerals, and their description will be omitted.

1. Overview of Second Switch Device

Figure 10:
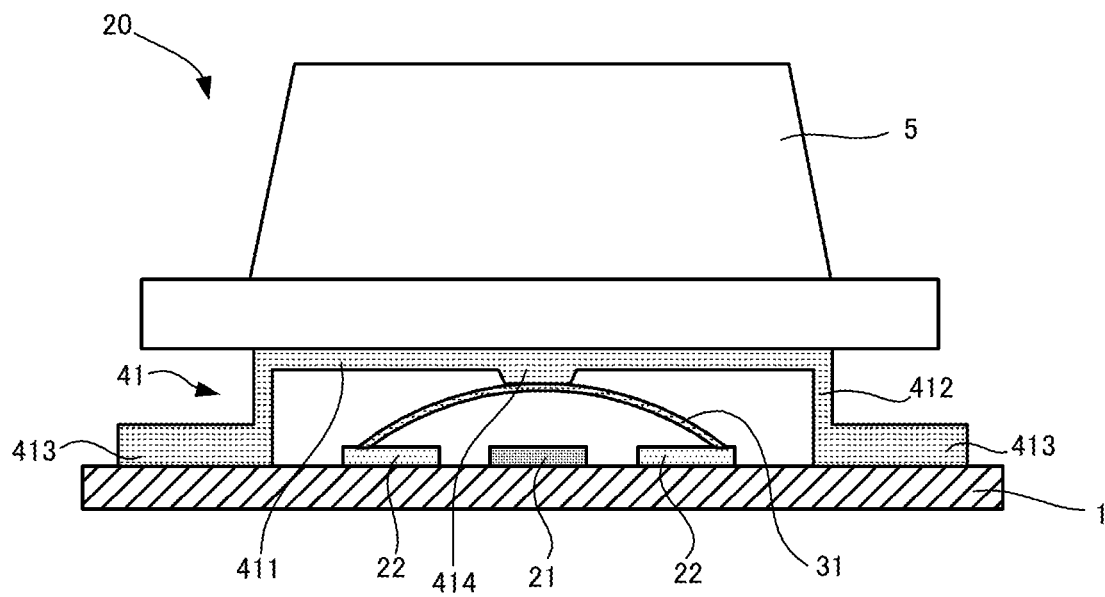
FIG. 10 is a cross-sectional view showing a second embodiment of a switch device according to the present invention.
Figure 11:
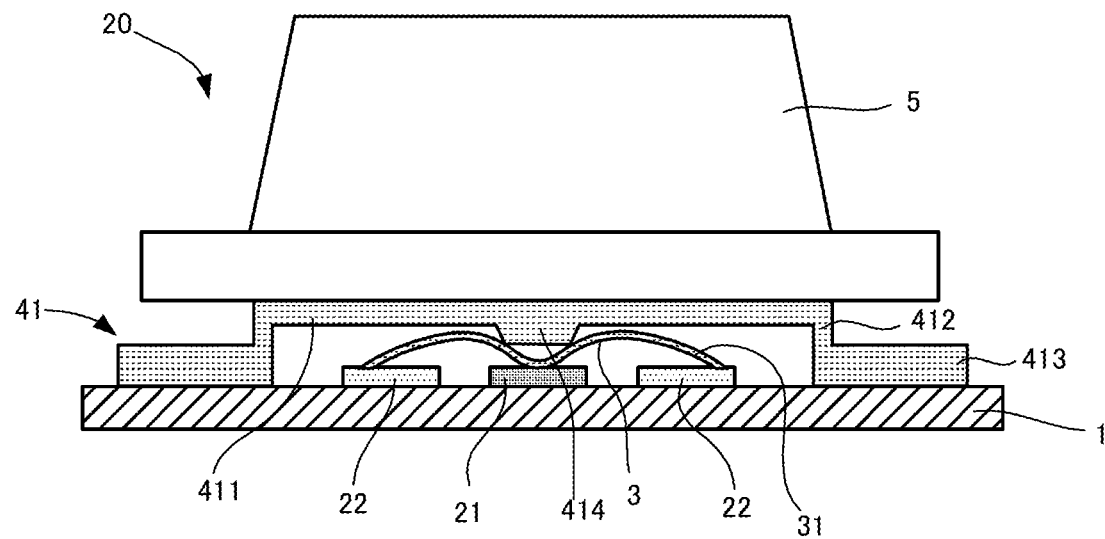
FIG. 11 is a cross-sectional view of the second switch device shown in FIG. 10 that is in an electrically connected state.
Figure 12:
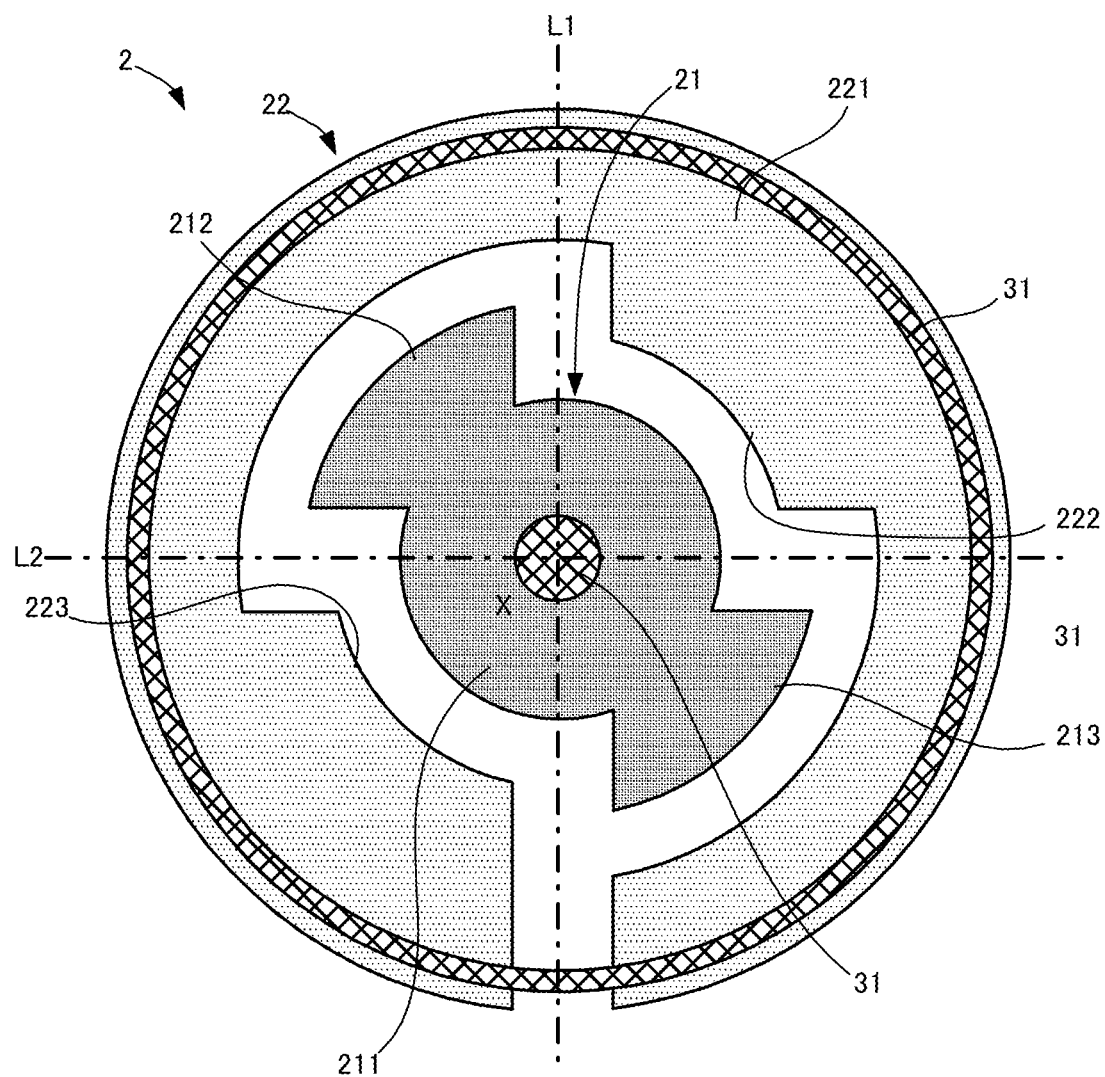
FIG. 12 is a plan view showing a positional relationship between a conductive member and a conductive pattern of the second switch device shown in FIG. 11.

FIG. 10 is a cross-sectional view when a second switch device according to the second embodiment is in a not-electrically connected state, FIG. 11 is a cross-sectional view of the second switch device in an electrically connected state, and FIG. 12 is a plan view showing a contact state of a conductive pattern and a second conductive member in an electrically connected state. As shown in FIG. 10, a support member 41 of a second switch device 20 includes a plate-shaped main portion 411, and a tubular leg 412 that extends downward from a circumferential edge of the main portion 411, and these portions are made of an elastic material such as rubber as a single body. Also, a lower end portion of the leg portion 412 is provided with a flange portion 413 that extends radially outward. Also, the lower end portion of the leg portion 42 is fixed to the printed-circuit board 1 to surround the surrounding portion of the conductive pattern 2. Further, the lower surface of the main portion 411 is provided with a protrusion 414 that protrudes downward.

The second conductive member 31 is made of a conductive material such as deformable metal, and is formed into a dome shape that protrudes upward. Also, the circumferential edge of the second conductive member 31 is fixed onto an outer circumferential portion 221 of the second land electrode. Also, in the not-electrically connected state shown in FIG. 10, the protrusion 414 of the support member 41 and the top of the second conductive member 31 are in contact with each other.

When the button member 5 is pressed down in the state shown in FIG. 10, the leg portion 412 made of an elastic material is compressed, and accordingly, the protrusion 414 presses the center portion of the second conductive member 31 downward. Accordingly, as shown in FIGS. 11 and 12, the center portion of the second conductive member 31 deforms to protrude downward, and the deformed center portion comes into contact with the vicinity of the center point X of the first land electrode 21. In this manner, the two land electrodes 21 and 22 of the conductive pattern 2 are electrically connected to each other via the second conductive member 31. On the other hand, when the button member 5 is released, the leg portion 412 of the support member 41 is restored to the initial state, and accordingly the second conductive member 31 is also restored to the initial state. That is, the center portion of the second conductive member 31 separates from the first land electrode 21. As a result, the electrical connection between the two land electrodes 21 and 22 is released.

The length of deformation of the second conductive member 31 between a not-electrically connected state and an electrically connected state, that is to say the stroke of the button member 5, is shorter in the second switch device 20 configured as described above, compared to the rubber switch of the first embodiment. Also, the second conductive member 31 is made of metal or the like, and thus needs a slight amount of force to deform, and thus, compared to the rubber switch, a feel that is slightly harder to press, that is, a click feel, can be obtained.

2. Features

The conductive pattern 2 according to this embodiment is the same as that of the first embodiment. This conductive pattern 2 includes the first land electrode 21 and the second land electrode 22 formed to surround the first land electrode 21, and thus can also be used in a so-called dome switch having a dome-shaped conductive member 31 as described above. That is, when the state in which the circumferential edge of the dome-shaped second conductive member 31 is in contact with the second land electrode 22 is regarded as a not-electrically connected state, by pressing the center portion of the second conductive member 31 down, the vicinity of the pressed center can be brought into contact with the first land electrode 21 surrounded by the second land electrode 22, and the two land electrodes 21 and 22 can be electrically connected to each other.

In this manner, this conductive pattern 2 can be used in the rubber switch of the first embodiment and the dome switch of the second embodiment. Thus, if a rubber switch and a dome switch are provided in one input device, for example, it is possible to use the same conductive pattern 2. Also, a plurality of the above-described conductive patterns 2 may be formed, the above-described first conductive member 3 or the above-described second conductive member 31 may be selectively arranged according to a user request, and a rubber switch or a dome switch (or the other types of switch) may be formed, for example. That is, a conductive pattern can be shared by a plurality of input devices with different combinations and arrangements of rubber switches and dome switches. Thus, the conductive pattern 2 need not be changed depending on the types of switch devices, and it is possible to easily constitute a switch device and also an input device. Note that, in this example, the conductive pattern 2 to be electrically connected to the first conductive member 3 constitutes a first contact portion of the present disclosure, and the conductive pattern 2 to be electrically connected to the second conductive member constitutes a second contact portion of the present disclosure.

Also, due to the order given by a user, it is possible to manufacture an input device such as a controller provided with a plurality of switch devices through the following processes, for example.

(1) A printed-circuit board provided with a plurality of the above-described conductive patterns 2, and an input device in which the printed-circuit board is housed are prepared.

(2) A request regarding which switch to use for a switch device compatible with each conductive pattern is received from a user. The request may be received online, or may be directly received by manual input.

(3) Information regarding which switch to be provided for each conductive pattern 2 is acquired.

(4-1) A switch is mounted on a controller by a machine based on the acquired information in an automated production line.

(4-2) In the case of manual input, by displaying acquired information or issuing an instruction based on information to an operator, a switch is mounted on a controller through manual input or a machine operated through manual input.

It is possible to manufacture an input device according to a user request through the above-described processes.

C. Third Embodiment

Figure 13:
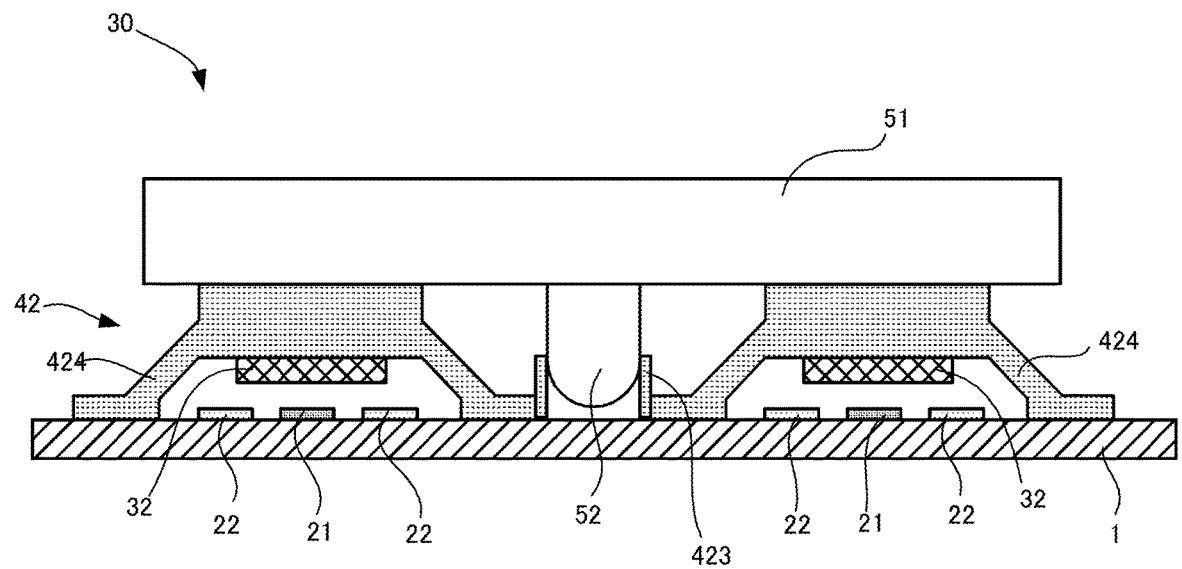
FIG. 13 is a cross-sectional view showing a third embodiment of a switch device according to the present invention.
Figure 14:
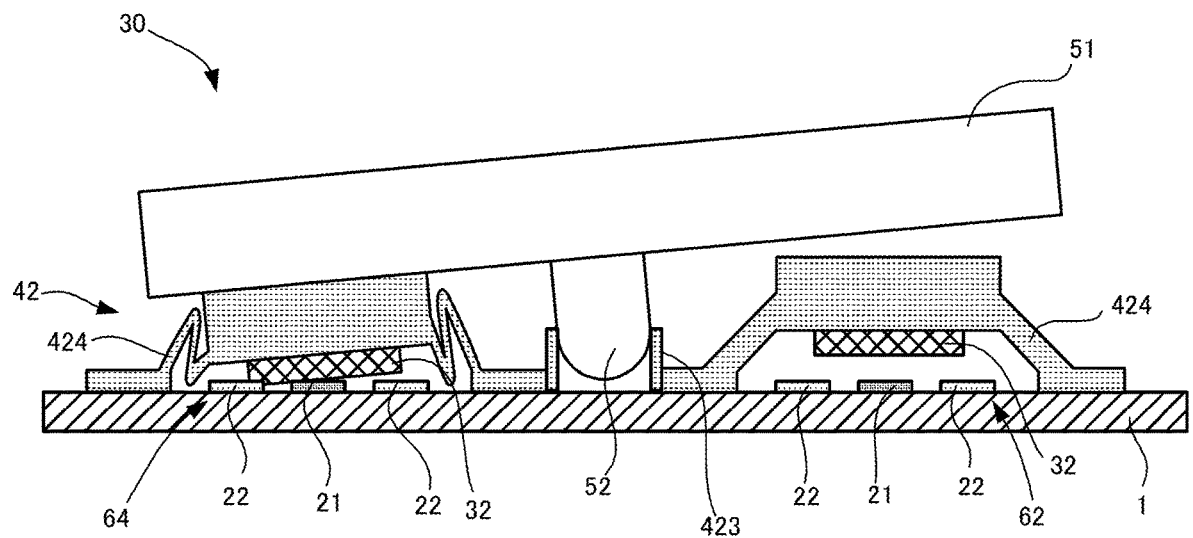
FIG. 14 is a cross-sectional view of the third switch device shown in FIG. 13 that is in an electrically connected state.

The following describes a third switch device according to a third embodiment. FIG. 13 is a cross-sectional view of the third switch device in the initial state (not-electrically connected state), FIG. 14 is a cross-sectional view of the third switch device in an electrically connected state, FIG. 15 is a plan view of a keytop, FIG. 16 is a bottom view of a support member, and FIG. 17 is a plan view showing the arrangement of four outer circumferential contact portions (fourth contact portions).

As shown in FIG. 13, a third switch device 30 includes a keytop 51 that is arranged on the above-described printed-circuit board 1 and is formed in a cross shape in plan view, a support member 42 that is attached to a lower surface of the keytop (a direction input portion) 51 and is made of an elastic material such as rubber, and four conductive rubbers 32 attached to a lower surface of the support member 42. Also, the printed-circuit board 1 is arranged below the support member 42, and as shown in FIG. 17, four outer circumferential contact portions 61 to 64 are formed on the printed-circuit board 1. The outer circumferential contact portions 61 to 64 have the same configuration as the above-described conductive pattern 2.

Figure 15:
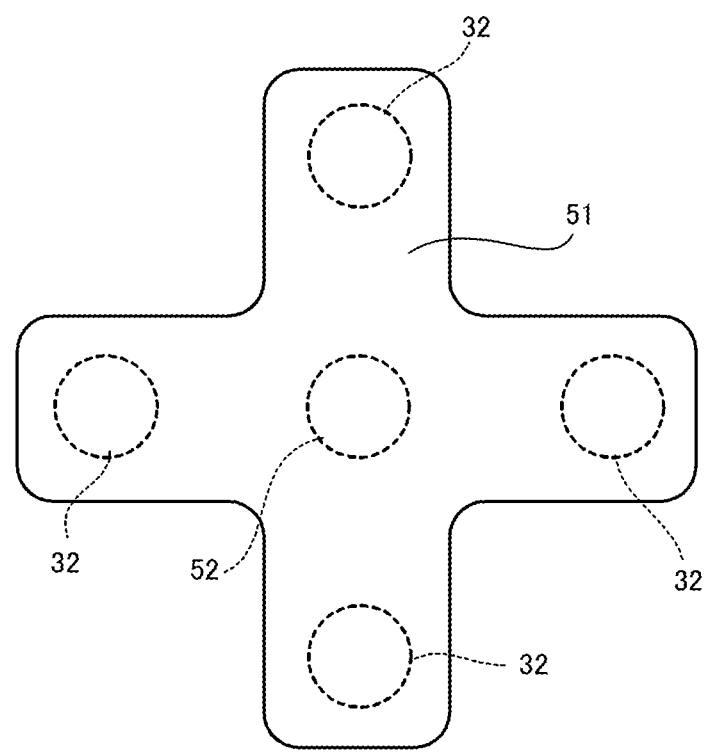
FIG. 15 is a plan view of a keytop in the third switch device shown in FIG. 12.

As shown in FIG. 15, the keytop 51 is formed in a cross shape, and the conductive rubbers 32 are arranged at positions that correspond to four end portions thereof via the support member 42. Also, as shown in FIG. 13, a shaft member (fulcrum) 52 for inclining the keytop 51 is provided at the center of the lower surface of the keytop 51, and the shaft member 52 protrudes downward.

Figure 16:
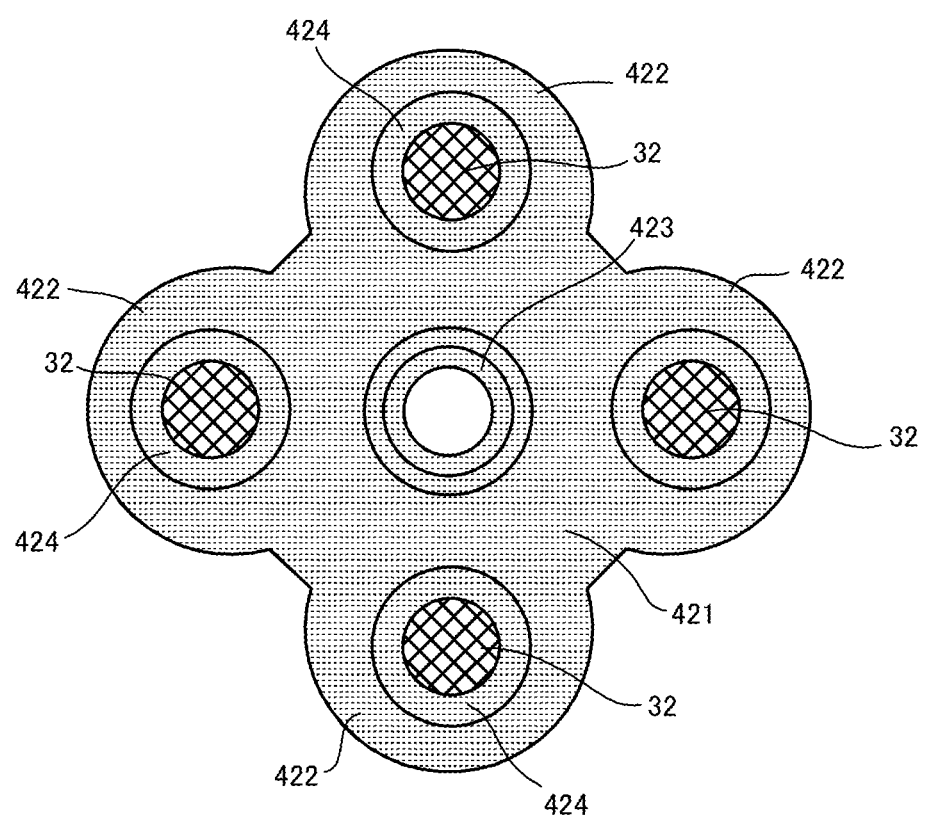
FIG. 16 is a bottom view of a support member in the third switch device shown in FIG. 12.

As shown in FIG. 16, the support member 42 includes a main portion 421 and four circular protruding portions 422 that protrude at 90-degree intervals from the circumferential edge of the main portion 421. As shown in FIG. 13, the main portion 421 is provided with a tubular support portion 423, and the shaft member 52 of the keytop 51 is housed in the tubular support portion 423. Also, as shown in FIG. 14, the keytop 51 is configured to be inclined with the shaft member 52 as an axis such that any one of the four end portions of the keytop 51 comes close to the printed-circuit board 1.

Also, circular-plate shaped conductive rubbers 32 are attached to lower surfaces of the protruding portions 422 of the support member 42. Also, as shown in FIG. 13, the lower surfaces of the protruding portions 422 are provided with leg portions 424 that widen at the bottom portions thereof to surround the conductive rubbers 32, and the lower end portions of the leg portions 424 are fixed to the printed-circuit board 1 to surround the contact portions 61 to 64.

As shown in FIG. 17, four outer circumferential contact portions 61 to 64 constituted by the above-described conductive pattern 2 are formed on the printed-circuit board 1. The outer circumferential contact portions 61 to 64 are arranged at 90-degree intervals on the circumference of a predetermined circle C4, and are arranged to respectively face the conductive rubbers 32. Also, the shaft member 52 of the keytop 51 is arranged to face a center point X4 of the circle C4. Here, for convenience of description, it is presumed that the outer circumferential contact portion arranged in an upper portion in FIG. 17 is referred to as a "first outer circumferential contact portion 61", and a second outer circumferential contact portion 62, a third outer circumferential contact portion 63, and a fourth outer circumferential contact portion 64 are arranged clockwise starting from the first outer circumferential contact portion 61. Also, the first to fourth outer circumferential contact portions 61 to 64 are arranged in a state in which the first to fourth outer circumferential contact portions 61 to 64 are respectively rotated 180 degrees, 270 degrees, 0 degrees, and 90 degrees clockwise from the reference rotation positions shown in FIG. 3. That is, the third outer circumferential contact portion 63 is located at the reference rotation position. Accordingly, the first to fourth outer circumferential contact portions 61 to 64 are arranged at positions farthest from the center X4 of the circle C4 such that all the slits 225 face outward in the radial direction of the circle C4.

According to the above-described configuration, as shown in FIG. 14, for example, when the keytop 51 is inclined about the shaft member 52, any one of the conductive rubbers 32 comes into contact with the outer circumferential contact portions 61 to 64 that face the conductive rubbers 32, and accordingly, the land electrodes 21 and 22 of the outer circumferential contact portions 61 to 64 are electrically connected to each other. Also, although the keytop 51 is usually inclined such that any one of the end portions thereof comes close to the printed-circuit board 1, it is also possible to incline the keytop 51 such that two adjacent end portions thereof come close to the printed-circuit board 1. In this case, the land electrodes 21 and 22 are electrically connected to each other in two of the four outer circumferential contact portions 61 to 64.

Figure 18:
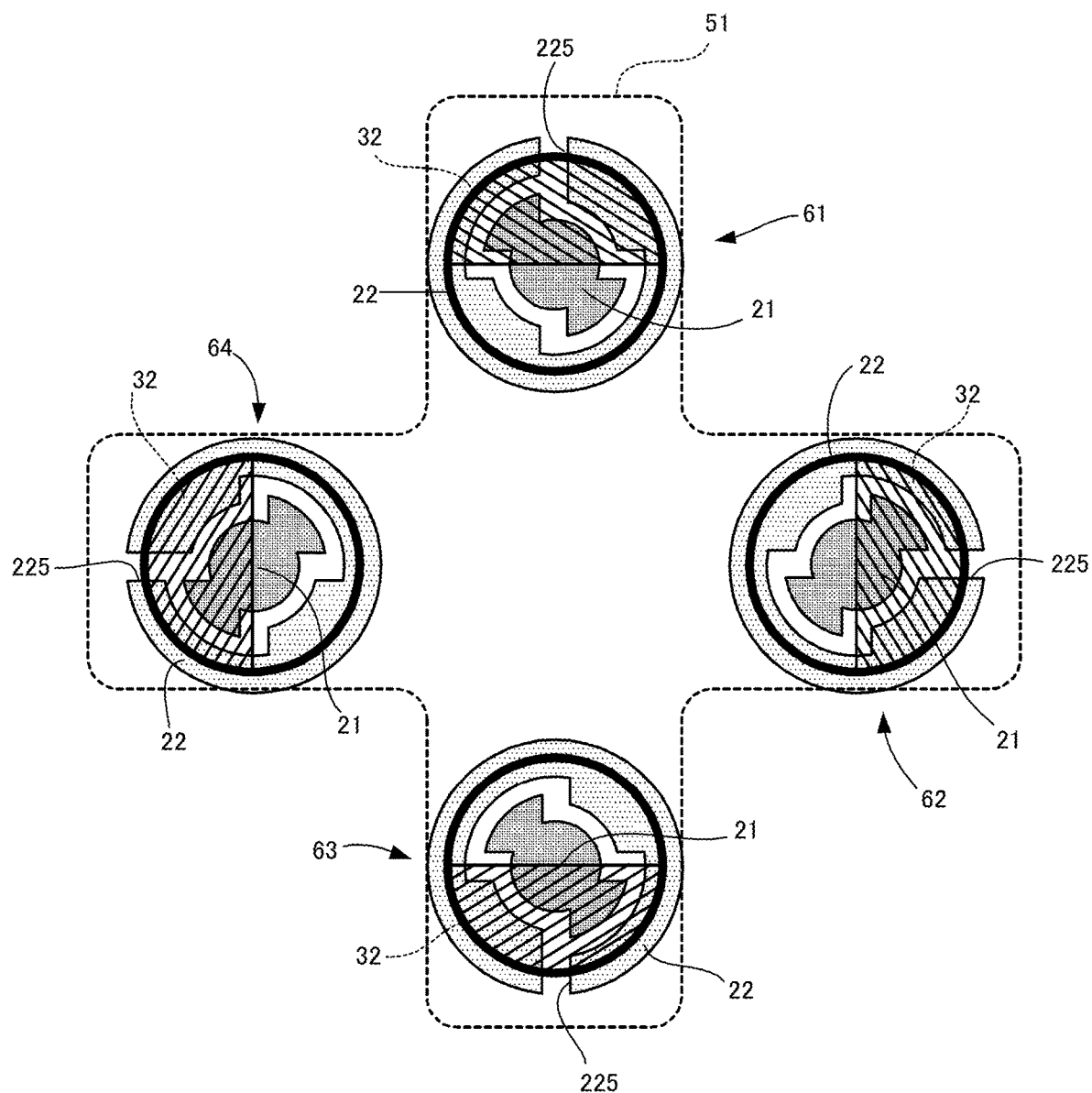
FIG. 18 is a plan view showing a state in which conductive rubber and a conductive pattern are in contact with each other in the third switch device shown in FIG. 12.
Figure 19:
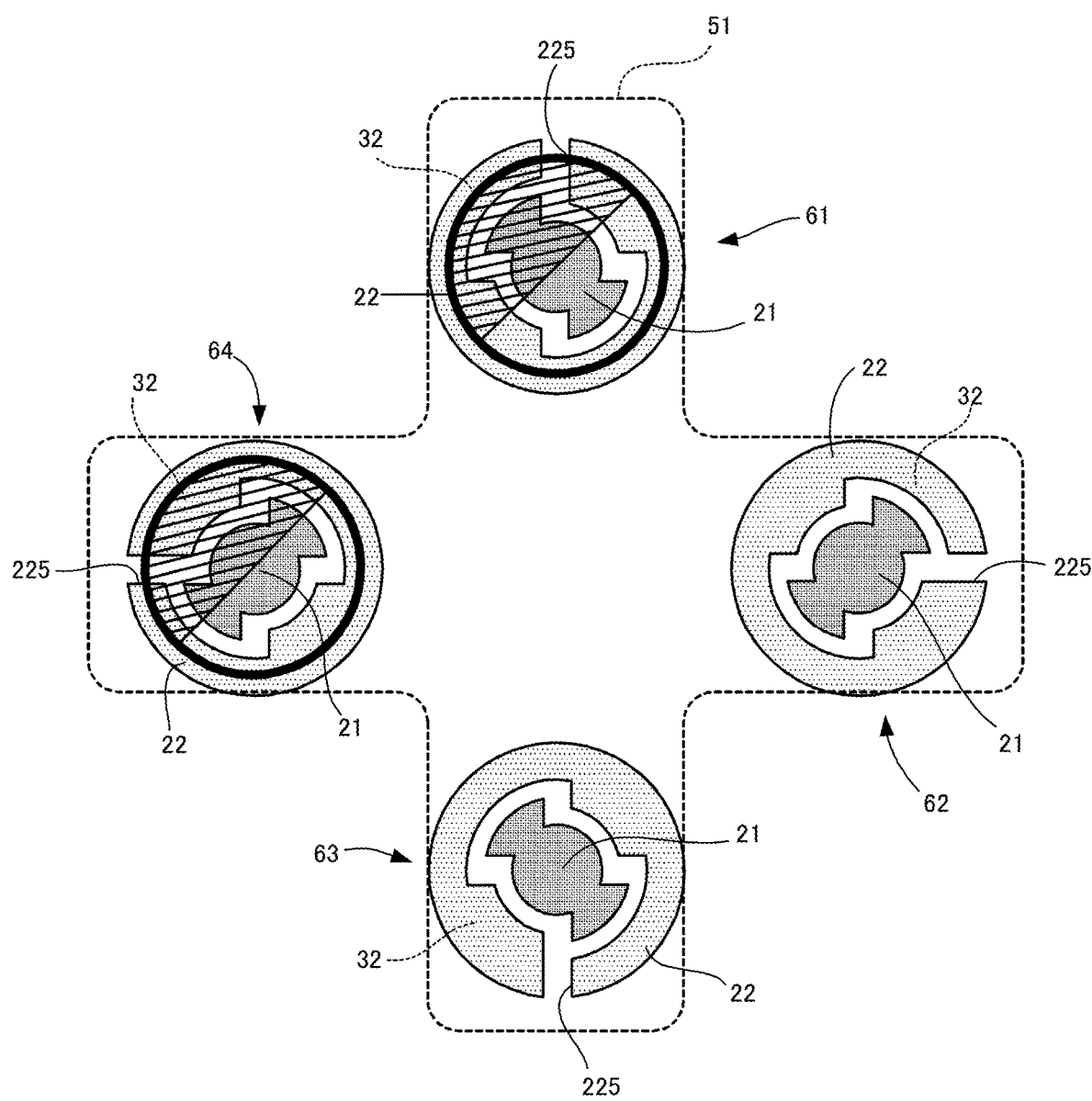
FIG. 19 is a plan view showing a state in which conductive rubber and a conductive pattern are in contact with each other in the third switch device shown in FIG. 12.

With the switch device configured as described above, the conductive rubbers 32 come into contact with the outer circumferential contact portions due to the keytop 51 being inclined, and thus, in particular, as shown in FIG. 18, a semicircular portion of a conductive rubber 32 located on a side far from the center X4 is likely to come into contact with the outer circumferential contact portion. In such a case as well, the two land electrodes can be electrically connected to each other via the conductive rubber. Also, even if two end portions of the keytop 51 are pushed to come close to the printed-circuit board 1, as shown in FIG. 19, the two land electrodes 21 and 22 are electrically connected to each other at two contact portions (the first outer circumferential contact portion 61 and the fourth outer circumferential contact portion 64 in this example).

5. Features (1) The third switch device 30 is provided with four outer circumferential contact portions having the above-described conductive pattern. Thus, even if a position to be pressed by the conductive rubber 32 is biased in one direction, it is possible to electrically connect the two land electrodes 21 and 22 to each other. Also, as shown in FIGS. 6 to 9, even if the position of the conductive rubber 32 is displaced from the reference position at each outer circumferential contact portion of the third switch device, for example, it is possible to electrically connect the two land electrodes 21 and 22 to each other.

(2) Because the four slits 252 are arranged at symmetric positions, stable operations can be expected. Note that, as will be described later, if no slit is provided in each conductive pattern 2 in the third switch device 30, each conductive pattern 2 constitutes the third contact portion of the present disclosure.

D. Variations

Although embodiments of the present invention have been described above, the present invention is not limited to the above-described embodiments, and various changes can be made without departing from the gist of the invention. The following changes can be made, for example. Also, the following variations can be combined as appropriate.

Figure 20:
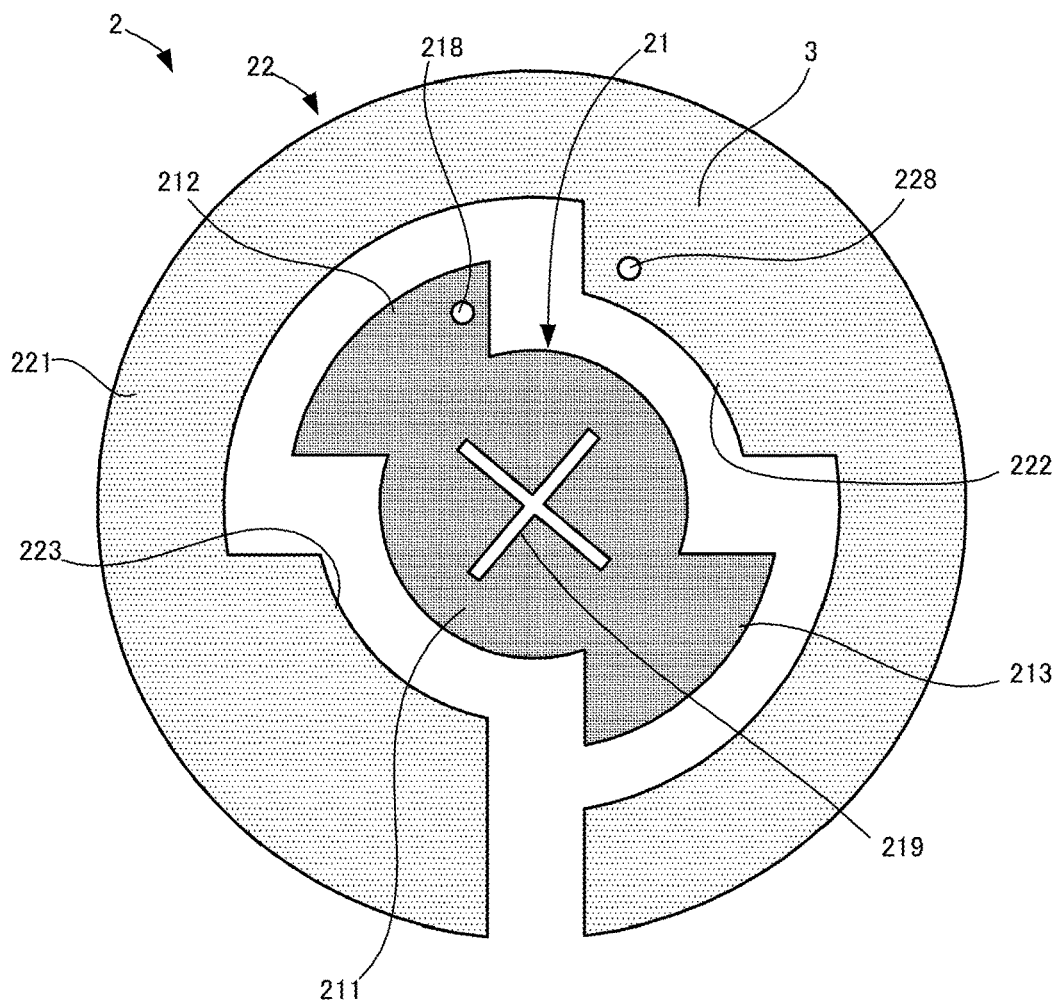
FIG. 20 is a plan view showing another example of a conductive pattern.

(1) There is no particular limitation on the wiring to the land electrodes on the printed-circuit board, and wiring can be formed as appropriate so as not to be in contact with the other electrodes. Also, as shown in FIG. 20, for example, it is possible to form through holes at positions corresponding to the land electrodes 21 and 22, and form wiring in the through holes on the printed-circuit board 1. Thus, the land electrodes 21 and 22 are provided with holes 218 and 228 at positions corresponding to the through holes. Accordingly, wiring need not be formed on a surface of the printed-circuit board 1 that is provided with the land electrodes 21 and 22. Note that, although portions of the land electrodes 21 and 22 are separated apparently, if these portions are connected to each other by wiring and have the same potential, these electrodes can be regarded as the same land electrode. From this viewpoint, a portion of the first land electrode 21 or a portion of the second land electrode 22 may be separated therefrom, for example.

Also, a through hole can be used as an air hole. With the first switch device 10, a closed space is formed between the printed-circuit board 1 and the support member 4 in a portion where the conductive pattern 2 is arranged, and thus, if the button member is pressed down, there is a concern that the closed space will have a negative pressure, and the pushed support member will not immediately return to the initial state. In view of this, by linking the closed space and an outer portion with the through hole, it is possible to inhibit the close space from having a negative pressure even if the support member is pushed. Note that, if a through hole is used as an air hole, the through holes need not be formed at positions corresponding to the land electrodes 21 and 22, and through holes can be arranged between the two land electrodes 21 and 22, for example. Also, there is no particular limitation on the number or positions of holes 218 and 228, and through holes.

Figure 21:
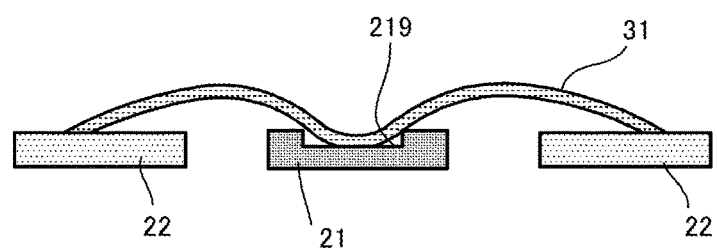
FIG. 21 is a cross-sectional view showing a state in which a conductive member is in contact with the conductive pattern shown in FIG. 20.

(2) As shown in FIG. 20, it is possible to form a cross-shaped recess 219 in the main portion 211 of the first land electrode 21. In this manner, if this conductive pattern 2 is used in the second switch device 20, for example, as shown in FIG. 21, it is possible to increase the contact area between the pushed conductive member 31 and the main portion 211. That is, the pushed conductive member 31 comes into contact with the bottom surface and the wall surface of the recess 219, and thus, the conductive member 31 and the main portion 211 can be readily and electrically connected to each other. From this viewpoint, the shape of the recess 219 is not limited to a cross shape, and may be various shapes such as a circular shape and a polygonal shape.

(3) There is no particular limitation on the position of the slit 225 in the second land electrode 22, and the slit 225 can be formed at a position other than the position shown in FIG. 3. Also, as in the above-described embodiment, with regard to the number of slits 22, the second land electrode 22 may be provided with one slit 225, or with two or more slits 225. Alternatively, a configuration may also be adopted in which the second land electrode 22 has a continuous annular shape or the like surrounding the first land electrode 21 without providing slits in the second land electrode 22, for example. Note that, if one slit is provided in the second land electrode 22, the slit may be formed such that the first land electrode 21 is not located in this slit.

Figure 22:
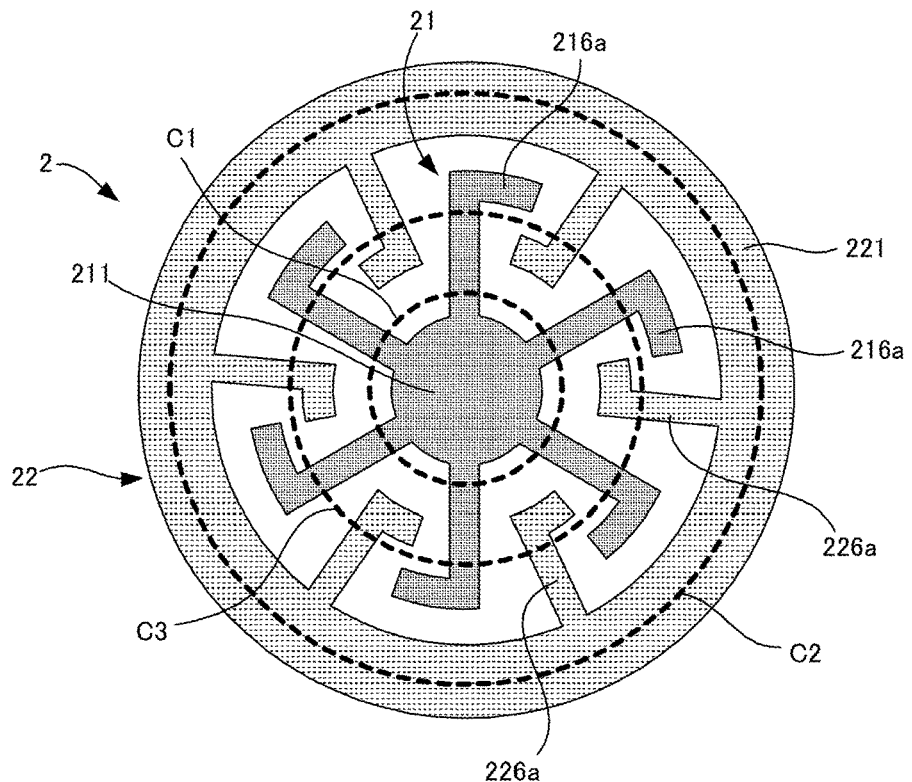
FIG. 22 is a plan view showing another example of a conductive pattern.

(4) Although the first land electrode 21 is provided with two inner protruding portions 212 and 213, and the second land electrode 22 is provided with two outer protruding portions 222 and 223 in the above-described embodiment, the inner protruding portions and the outer protruding portions can have various forms. As shown in FIG. 22, for example, it is possible to provide six inner protruding portions 216a and six outer protruding portions 226a that are formed in an L-shape, and to arrange the inner protruding portions 216a and the outer protruding portions 226a in an alternating manner in the circumferential direction.

Figure 23:
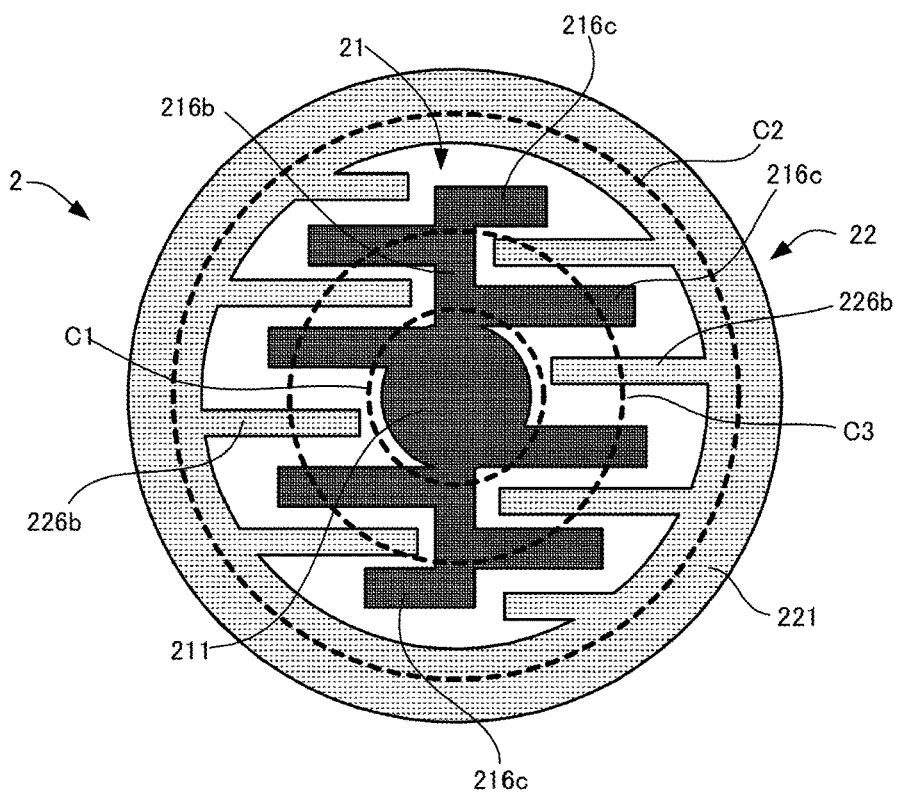
FIG. 23 is a plan view showing another example of a conductive pattern.

In the example shown in FIG. 23, it is possible to provide first protruding portions 216b that extend in the up-down direction from the main portion 211 of the first land electrode 21, and to provide a plurality of second protruding portions 216c protruding from the protruding portions 216b in an alternating manner in the right-left direction. These first protruding portions 216b and second protruding portions 216c constitute inner protruding portions. Also, it is possible to form outer protruding portions 226b protruding from the outer circumferential portion 221 of the second land electrode 22 toward a portion located between adjacent second protruding portions 216c.

Figure 24:
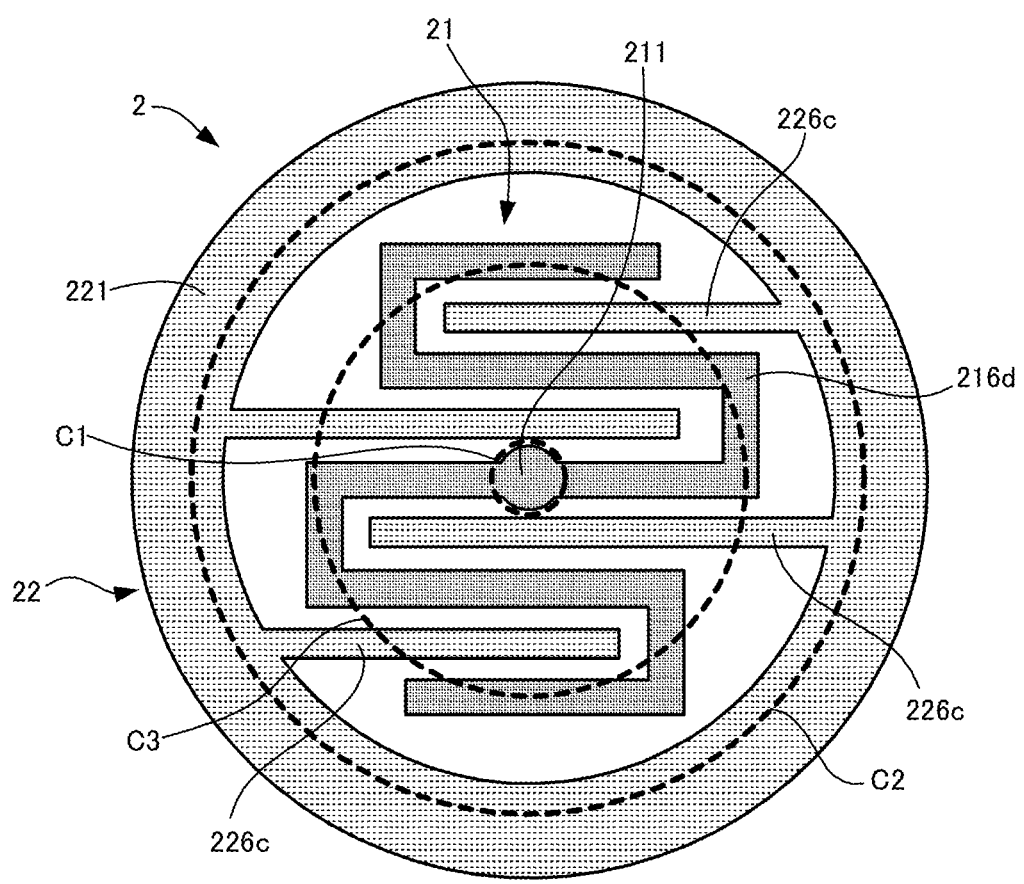
FIG. 24 is a plan view showing another example of a conductive pattern.

In the example shown in FIG. 24, it is possible to form one inner protruding portion 216d in a rectangular wave shape that oscillates in the right-left direction, and to arrange the main portion 211 of the first land electrode 21 at the center thereof. Also, it is possible to form outer protruding portions 226b protruding from the outer circumferential portion 221 of the second land electrode 22 toward recesses in the rectangular wave shape located in the right-left direction.

The above-described conductive patterns are merely examples, and there is no particular limitation on the numbers, positions, shapes, lengths in the radial direction, and arrangements (e.g., a radial shape) of inner protruding portions and outer protruding portions. Also, the inner protruding portions and the outer protruding portions need not be arranged side-by-side in an alternating manner in the circumferential direction, and the inner protruding portions or the outer protruding portions may be arranged side-by-side in the circumferential direction. Also, the inner protruding portions or the outer protruding portions need not be evenly arranged side-by-side in the circumferential direction. However, although shown in FIGS. 22 and 23, for example, the conductive pattern 2 needs only to be formed according to the above-described three concentric circles C1 to C3. That is, only the first land electrode 21 is arranged in the circle C1, only the second land electrode 22 is arranged in the circle C2, and the circle C3 is formed such that the inner protruding portions and the outer protruding portions pass through the circle C3.

(5) The main portion 211 of the first land electrode 21 need not be circular, and may have a polygonal shape or an irregular shape. Also, the second land electrode 22 needs only to surround at least a portion of the first land electrode 21, and may have a polygonal shape or an irregular shape, in addition to an annular shape. Thus, it is possible to form the land electrodes 21 and 22 such that portions of the land electrodes 21 and 22 pass through a circle C, without forming protruding portions in the land electrodes 21 and 22.

(6) Although the rubber switch described in the first embodiment as an outer circumferential contact portion is used in the above-described third switch device 30, it is possible to change at least one of the four outer circumferential contact portions 61 to 64 to the dome-shaped conductive member 31 described in the second embodiment. Accordingly, it is possible to change a stroke to realize electrical connection and the hardness of pressing depending on the position where the keytop 51 is pressed down. Also, although the keytop 51 has a cross shape and four outer circumferential contact portions 61 to 64 are provided to correspond to the cross shape in the third switch device 30, there is no limitation thereto. That is, it is sufficient to form the keytop 51 such that the keytop 51 has two or more end portions (protruding portions), and to determine the number of outer circumferential contact portions according to these end portions. It is possible to form a keytop provided with three end portions (protruding portions), and to provide three outer circumferential contact portions according to the three end portions, for example.

(7) Although a so-called dome switch in which a dome-shaped conductive member 31 is used has been described in the second embodiment, such a conductive member may be configured such that one portion located at the center comes into contact with a conductive pattern, or a plurality of portions (protruding portions) come into contact with a conductive pattern by forming a plurality of minute protruding portions in this center portion, instead of one portion.

(8) Even if a land electrode has the above-described configuration, if an insulating member is placed on the land electrode and electrical connection with the other land electrode cannot be realized via this portion, this portion cannot be regarded as the land electrode according to the present disclosure.

(9) Although inner protruding portions 212 and 213 and outer protruding portions 222 and 223 that are adjacent to each other are included in any one of the arcs of the third circle C3 having an central angle of 180 degrees in the above-described embodiment, a configuration may also be adopted in which an inner protruding portion and an outer protruding portion that are adjacent to each other are included in at least one arc having a central angle of 180 degrees, for example. Alternatively, a configuration may also be adopted in which an inner protruding portion and an outer protruding portion that are adjacent to each other is included in at least one arc having a central angle of 120 degrees, 90 degrees, or 60 degrees.

(10) It is possible to design a conductive pattern from various viewpoints, and it is sufficient that, when the distance from the center of the circular main portion 211 of the first land electrode 21 to the leading end of an inner protruding portion (a first protruding portion) is a first distance (S1 in FIG. 3), and the distance between the leading end of an outer protruding portion (a second protruding portion) of the second land electrode and the center of the circular main portion 211 of the first land electrode 21 is a second distance (S2 in FIG. 3), the second distance is shorter than the first distance.

LIST OF REFERENCE NUMERALS

2 Conductive pattern
21 First land electrode
211 Main portion
212 First inner protruding portion
213 Second inner protruding portion
22 Second land electrode
221 Outer circumferential portion
222 First outer protruding portion
223 Second outer protruding portion
225 Slit
3 First conductive member
31 Second conductive member
51 Keytop (direction input portion)
61~64 Outer circumferential contact portion (fourth contact portion)
C1 First circle
C2 Second circle
C3 Third circle

What is claimed is:

1. A conductive pattern comprising:
a first land electrode; and
a second land electrode,
wherein:
at least a portion of the first land electrode is arranged inside of a first circle defined by a center point and a first radius,
the second land electrode is arranged on, but not completely within, a second circle defined by the center point and a second radius that is larger than the first radius, so as to surround the first land electrode,
the entire second land electrode is arranged outside of the first circle,
the entire first land electrode is arranged within the second circle and neither the first land electrode nor a portion electrically connected to the first land electrode is exposed on the second circle,
portions of the first land electrode and the second land electrode are arranged on a third circle defined by the center point and a third radius that is larger than the first radius and is smaller than the second radius, and
a gap is formed in a radial direction through the second land electrode, the first land electrode being positioned entirely radially inward of the gap.

2. The conductive pattern according to claim 1,
wherein at least a portion of the second land electrode is arranged on an outer side of the second circle, and
the first land electrode is not arranged on the outer side of the second circle.

3. The conductive pattern according to claim 1,
wherein the first land electrode includes:
a main portion arranged in an inner portion of the first circle, and
at least one inner protruding portion that protrudes radially outward from the main portion,
the second land electrode includes:
an outer circumferential portion arranged on the second circle, and
at least one outer protruding portion that protrudes radially inward from the outer circumferential portion, and
the inner protruding portion and the outer protruding portion are arranged on the third circle.

4. The conductive pattern according to claim 3,
wherein the inner protruding portion and the outer protruding portion are arranged in an alternating manner on the third circle.

5. The conductive pattern according to claim 4,
wherein the inner protruding portion and the outer protruding portion that are adjacent to each other on the third circle are arranged in any one of arcs of the third circle that have a central angle of 180 degrees.

6. The conductive pattern according to claim 1,
wherein a first conductive member having a contact surface is arranged, and
the first conductive member is configured such that the contact surface thereof is capable of coming into contact with both the first land electrode and the second land electrode.

7. The conductive pattern according to claim 1,
wherein a dome-shaped second conductive member is arranged, a circumferential edge portion of the dome-shaped second conductive member is fixed to the second land electrode, and the dome-shaped second conductive member is configured such that a center portion thereof comes into contact with the first land electrode when pressed down.

8. A switch device comprising:
at least one first contact portion and at least one second contact portion, each of the at least one first contact portion and the at least one second contact portion having the conductive pattern according to claim 1;
a first conductive member for electrical connection at the first contact portion; and
a second conductive member for electrical connection at the second contact portion,
wherein the first conductive member has a contact surface capable of coming into contact with the first and second land electrodes, and
the second conductive member is formed into a dome shape, a circumferential edge portion of the second conductive member is fixed to the second land electrode, and the second conductive member is configured such that a center portion thereof comes into contact with the first land electrode when pressed down.

9. A switch device comprising:
four third contact portions that each have the conductive pattern according to claim 1; and
a direction input portion that has four conductive members that are arranged above the third contact portions and are capable of respectively coming into contact with the third contact portions,
wherein the four third contact portions are arranged at 90-degree intervals on a predetermined circle,
the direction input portion is configured to cause the conductive members to come into contact with the third contact portions due to the direction input portion being inclined around a fulcrum provided at a position corresponding to a center point of the predetermined circle, and
the first land electrodes and the second land electrodes at the third contact portions are arranged on the predetermined circle.

10. A switch device comprising:
four fourth contact portions that each have the conductive pattern according to claim 1; and
a direction input portion that has four conductive members that are arranged above the fourth contact portions and are capable of respectively coming into contact with the fourth contact portions,
wherein the four fourth contact portions are arranged at 90-degree intervals on a predetermined circle,
the direction input portion is configured to cause the conductive members to come into contact with the fourth contact portions due to the direction input portion being inclined around a fulcrum provided at a position corresponding to a center point of the predetermined circle,
the first land electrodes and the second land electrodes at the fourth contact portions are arranged on the predetermined circle,
in each of the fourth contact portions, the second land electrode is provided with at least one slit for connecting a region that is surrounded by the second land electrode and is located between the first land electrode and the second land electrode, and an external portion of the second land electrode, and the slit in each of the fourth contact portions is arranged at a position located farthest from the center point of the predetermined circle.

11. A method for manufacturing a switch device, comprising:
forming at least one of the conductive patterns according to claim 1; and
arranging a first conductive member or a second conductive member at a position that corresponds to at least one of the conductive patterns,
wherein the first conductive member has a contact surface capable of coming into contact with the first and second land electrodes, and
the second conductive member is formed into a dome shape, a circumferential edge portion of the second conductive member is fixed to the second land electrode, and the second conductive member is configured such that a center portion thereof comes into contact with the first land electrode when pressed down.

12. A method for manufacturing an input device, comprising:
preparing a printed-circuit board on which a plurality of the conductive patterns according to claim 11 are formed;
receiving, from a user, in the input device in which the printed-circuit board is housed, information as to which of the first conductive member or the second conductive member is to be arranged at positions that correspond to the conductive patterns;
acquiring the information; and
attaching either the first conductive member or the second conductive member to the positions that correspond to the conductive patterns in the input device, based on the information,
wherein the first conductive member has a contact surface capable of coming into contact with the first and second land electrodes, and
the second conductive member is formed into a dome shape, a circumferential edge portion of the second conductive member is fixed to the second land electrode, and the second conductive member is configured such that a center portion thereof comes into contact with the first land electrode when pressed down.

13. A switch device comprising:
a printed-circuit board;
the conductive pattern of claim 1 formed on the printed-circuit board; and
wiring connected to the first land electrode to electrically connect the first land electrode to a predetermined circuit,
wherein the wiring is not formed on a surface of the printed-circuit board.

14. The conductive pattern according to claim 1, wherein the first land electrode is continuous across its diameter.

15. A conductive pattern comprising:
a first land electrode having a circular main portion; and
a second land electrode provided to surround the first land electrode;
wherein:
the first land electrode includes at least one first protruding portion that protrudes from the circular main portion toward the second land electrode, and a distance from a center of the circular main portion to a leading end of the first protruding portion is a first distance,
the second land electrode includes at least one second protruding portion that protrudes toward the circular main portion of the first land electrode, and a distance from the center of the circular main portion of the first land electrode to a leading end of the second protruding portion is a second distance that is shorter than the first distance, the entire first land electrode is positioned within a perimeter of the second land electrode, neither the first land electrode nor a portion electrically connected to the first land electrode is exposed outside of the perimeter of the second land electrode, and a gap is formed in a radial direction through the second land electrode, the first land electrode being positioned entirely radially inward of the gap.

16. The conductive pattern according to claim 15, wherein the conductive pattern is provided with two of the second protruding portions, and the second protruding portions are arranged to surround the first land electrode.

17. The conductive pattern according to claim 15, wherein the first land electrode is continuous across its diameter.

18. A conductive pattern comprising:

a first land electrode; and a second land electrode, wherein:

at least a portion of the first land electrode is arranged inside of a first circle defined by a center point and a first radius, the second land electrode is arranged on, but not completely within, a second circle defined by the center point and a second radius that is larger than the first radius, so as to surround the first land electrode, the entire second land electrode is arranged outside of the first circle, the entire first land electrode is arranged within the second circle, and portions of the first land electrode and the second land electrode are arranged on a third circle defined by the center point and a third radius that is larger than the first radius and is smaller than the second radius, wiring is connected to the first land electrode at a location entirely within the second circle and configured to electrically connect the first land electrode to a predetermined circuit and a gap is formed in a radial direction through the second land electrode, the first land electrode being positioned entirely radially inward of the gap.

19. The conductive pattern according to claim 18, wherein the first land electrode is continuous across its diameter.

\* \* \* \* \*